(12) United States Patent
Afzalian

(10) Patent No.: US 11,024,729 B2
(45) Date of Patent: Jun. 1, 2021

(54) METHOD FOR MANUFACTURING SEMICONDUCTOR DEVICE

(71) Applicant: TAIWAN SEMICONDUCTOR MANUFACTURING CO., LTD., Hsinchu (TW)

(72) Inventor: Aryan Afzalian, Chastre (BE)

(73) Assignee: TAIWAN SEMICONDUCTOR MANUFACTURING CO., LTD, Hsinchu (TW)

(*) Notice: Subject to any disclaimer, the term of this patent is extended or adjusted under 35 U.S.C. 154(b) by 0 days.

(21) Appl. No.: 16/358,394

(22) Filed: Mar. 19, 2019

(65) Prior Publication Data
US 2020/0105914 A1     Apr. 2, 2020

Related U.S. Application Data

(60) Provisional application No. 62/737,861, filed on Sep. 27, 2018.

(51) Int. Cl.
| | |
|---|---|
| *H01L 29/775* | (2006.01) |
| *H01L 29/10* | (2006.01) |
| *H01L 29/66* | (2006.01) |

(52) U.S. Cl.
CPC ........ *H01L 29/775* (2013.01); *H01L 29/1054* (2013.01); *H01L 29/66439* (2013.01)

(58) Field of Classification Search
CPC ............... H01L 29/775; H01L 29/7391; H01L 29/66356; H01L 29/66439; H01L 29/1054; H01L 29/4983; H01L 29/165; H01L 29/0646; H01L 29/0649
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |

(Continued)

OTHER PUBLICATIONS

Afzalian, A. et al., "Scaling perspective for III-V broken gap nanowire TFETs: An atomistic study using a fast tight-binding mode-space NEGF model", IEEE, Dec. 3, 2016, pp. 30.1.1-30.1.4.

(Continued)

*Primary Examiner* — Dung A. Le
(74) *Attorney, Agent, or Firm* — Maschoff Brennan

(57) ABSTRACT

A method for manufacturing a semiconductor device includes forming a first source/drain region in a substrate. A core channel region is formed on the first source/drain region. A barrier layer is formed on the core channel region. A shell is formed lining sidewalls of the core channel region and sidewalls and top surface of the barrier layer. The shell includes a channel portion in contact with the core channel region and a barrier portion in contact with the barrier layer. A second source/drain region is formed above the shell. A first gate electrode is formed to surround the channel portion of the shell. A conduction energy band of the channel portion of the shell is aligned with a conduction energy band of the barrier portion of the shell.

20 Claims, 27 Drawing Sheets

(56) References Cited

U.S. PATENT DOCUMENTS

| | | |
|---|---|---|
| 9,536,738 B2 | 1/2017 | Huang et al. |
| 9,576,814 B2 | 2/2017 | Wu et al. |
| 9,608,116 B2 | 3/2017 | Ching et al. |
| 10,141,252 B2 * | 11/2018 | Sung ................ H01L 23/49822 |

OTHER PUBLICATIONS

Wang, Peng-Fei, "Complemntary Tunneling-FETs (CTFET) in CMOS Technology", Nov. 10, 2003.
Dey, Anil W., et al., "Combining Axial and Radial Nanowire Heterostructures: Radial Esaki Diodes and Tunnel Field-Effect Transistors", NANO Letters, Aug. 6, 2013.

\* cited by examiner

METHOD FOR MANUFACTURING SEMICONDUCTOR DEVICE

PRIORITY CLAIM AND CROSS-REFERENCE

This application claims priority to U.S. Provisional Application Ser. No. 62/737,861, filed Sep. 27, 2018, which is herein incorporated by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

However, as the size of the smallest component has decreased, numerous challenges have risen. As features become closer, current leakage can become more noticeable, signals can crossover more easily, and power usage has become a significant concern. The semiconductor integrated circuit industry has produced numerous developments in effort to continue the process of scaling. One of the developments is the potential replacement or supplementation of the conventional MOS field-effect transistor by the tunneling field-effect transistor (TFET).

Tunneling FETs are promising devices that may enable further scaling of power supply voltage without substantially increasing off-state leakage currents due to its sub-60 mV/dec subthreshold swing. However, existing TFETs have not been satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
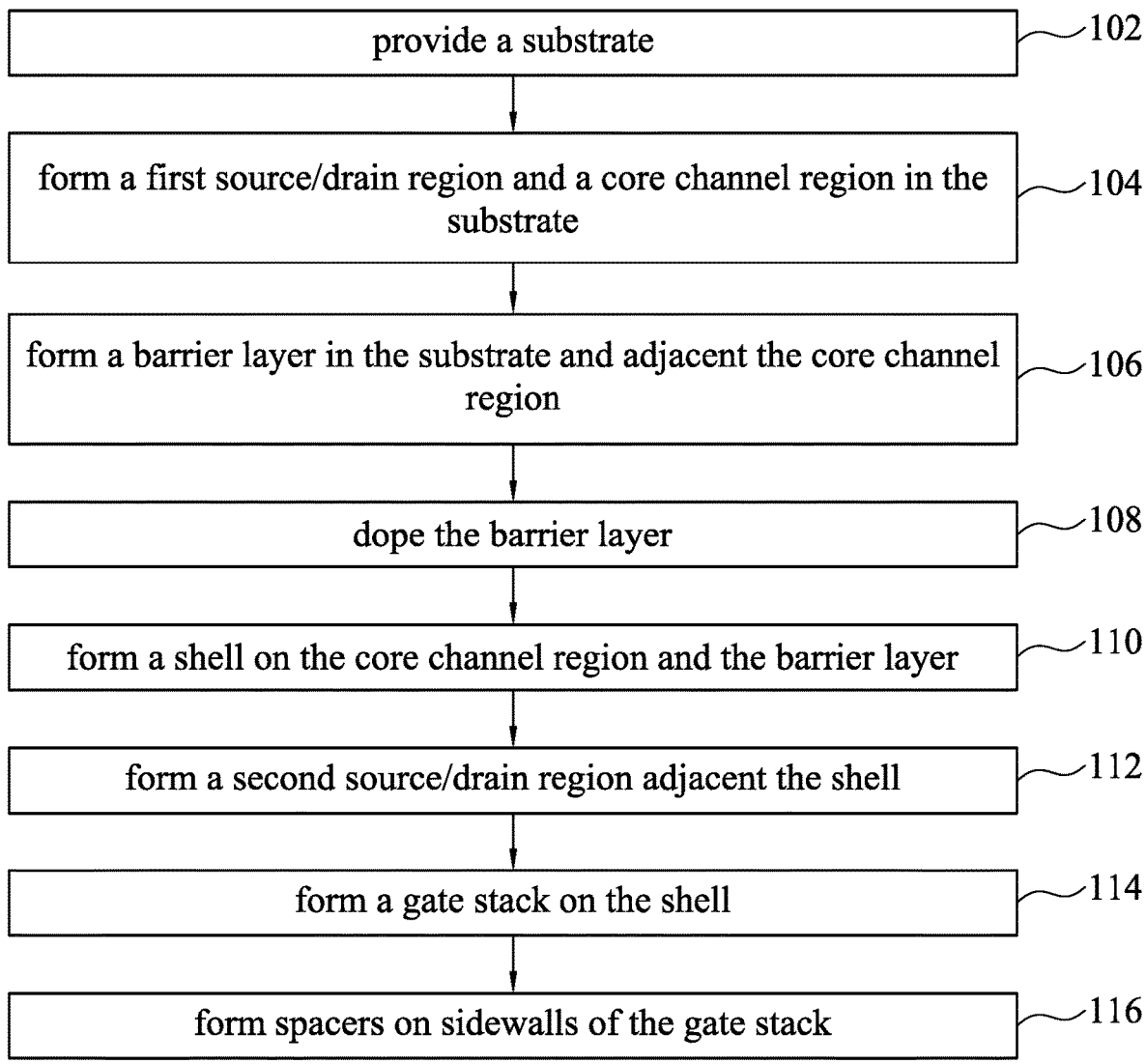
FIG. 1 is a flow chart of a method of manufacturing a semiconductor device in accordance with some embodiments of the present disclosure.
Figure 2:
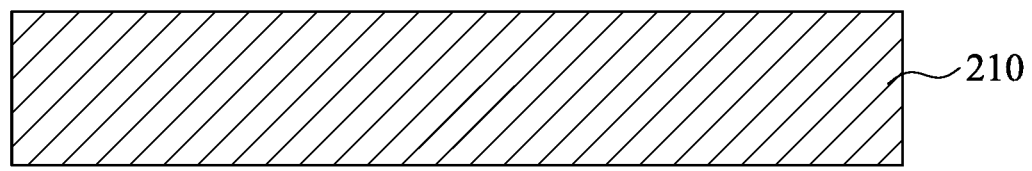
FIGS. 2 to 11 illustrate a semiconductor device at various stages according to aspects of the method of FIG. 1.
Figure 3:
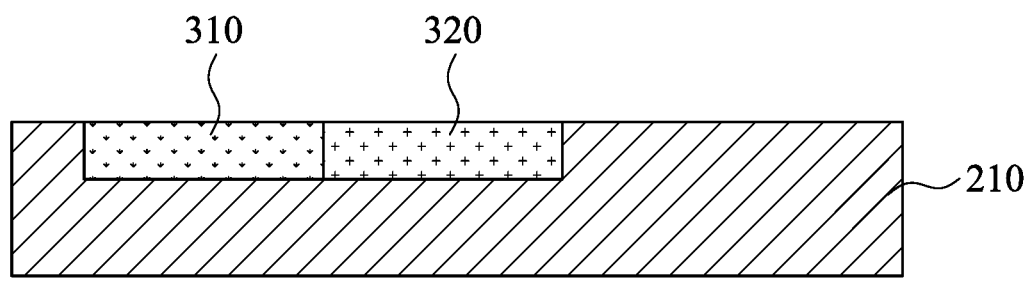
Figure 4:
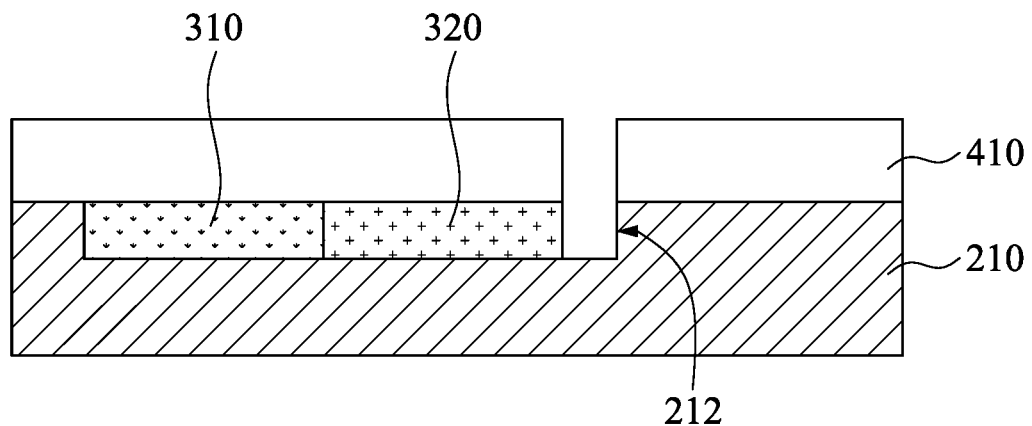

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 14A:
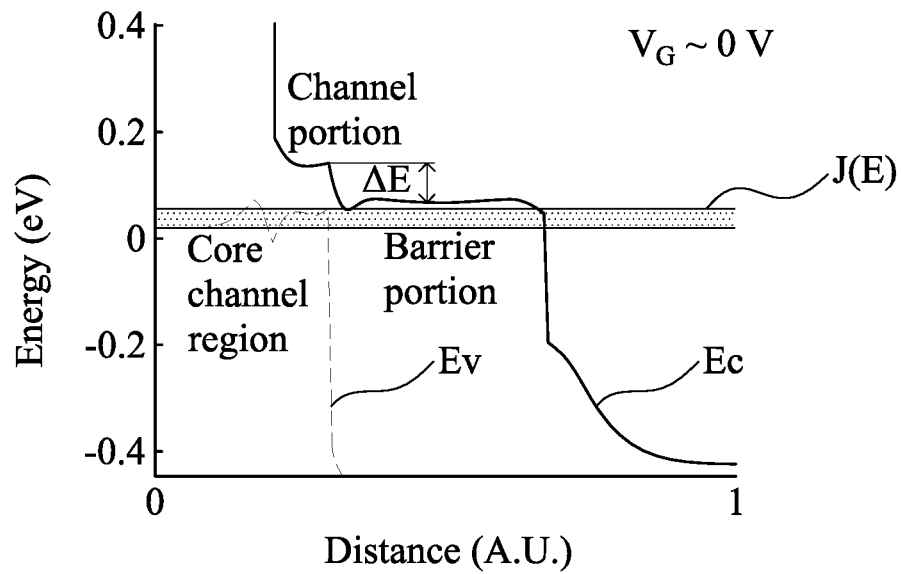
FIGS. 14A and 14B are energy band diagrams for the semiconductor devices of FIGS. 11-13 respectively on off- and on-state.

The present disclosure provides systems and methods that align a shell energy band of a channel region of a semiconductor device and a shell energy band of a barrier layer of the semiconductor device. In an exemplary embodiment, a semiconductor device includes first and second source/drain regions (e.g., the first and second source/drain regions 310 and 910 in FIG. 11 or the first and second source/drain regions 2810 and 3210 in FIG. 38), a core channel region (e.g., the core channel region 320 in FIG. 11 or the core channel region 2820 in FIG. 38) between the first and second source/drain regions, a barrier layer (e.g., the barrier layer 510' in FIG. 11 or the barrier layer 2910' in FIG. 38) between the core channel region and the second source/drain region, a shell (e.g., the shell 810 in FIG. 11 or the shell 3110 in FIG. 38) over the core channel region and the barrier layer, and a gate stack (e.g., the gate stack 1000 in FIG. 11 or the gate 3600 in FIG. 38) over the shell. The shell has a channel portion on the core channel region (e.g., the channel portion 812 in FIG. 11 or the channel portion 3112 in FIG. 38) and a barrier portion on the barrier region (e.g., the barrier portion 814 in FIG. 11 or the barrier portion 3114 in FIG. 38). A conduction energy band (for n-type device) or a valence energy band (for p-type device) of the channel portion of the shell is aligned with a conduction energy band (for n-type device) or a valence energy band (for p-type device) of the barrier portion of the shell. For example, as illustrated in FIG. 14A (an n-type device), the shell band mismatch, i.e., the difference $\Delta E$ between the conduction energy band of the channel portion and the conduction energy band of the barrier portion is very small, i.e., less than or equal to about 0.2 eV. In some embodiments, the conduction energy band of the channel portion of the shell is aligned with the conduction energy band of the barrier portion of the shell by doping the barrier layer. In other embodiments, the conduction energy band of the channel portion of the shell is aligned with the conduction energy band of the barrier portion of the shell by dividing the gate stack into two gates with different work functions. Devices including doped barrier layer, two gates, and/or doped shell provide electrostatic modulation at the barrier portion of the shell. The conduction/valence energy band of the barrier portion can be substantially aligned with the conduction/valence energy band of the channel portion of the shell. With such a configuration, the on-state current of the semiconductor device can be increased with low power consumption.

It is also noted that the present disclosure presents embodiments in the form planar or multi-gate transistors (planar or vertical), which may include fin-type multi-gate transistors referred to herein as FinFET devices. Such a device may include a P-type FinFET device or an N-type FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a flow chart of a method 100 of manufacturing a semiconductor device in accordance with some embodiments of the present disclosure. FIGS. 2 to 11 illustrate a semiconductor device at various stages according to aspects of the method of FIG. 1. In some embodiments, the semiconductor device shown in FIGS. 2 to 11 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, bipolar transistors, high voltage transistors, high frequency transistors, other memory cells, and combinations thereof. In some embodiments, the semiconductor device shown in FIGS. 2 to 11 has a horizontal transistor structure.

The method 100 begins at block 102 where a substrate is provided. Referring to the example of FIG. 2, in some embodiments of block 102, a substrate 210 is provided. The substrate 210 may be a semiconductor substrate such as a silicon substrate. The substrate 210 may include various layers, including conductive or insulating layers formed on the substrate 210. The substrate 210 may include various doping configurations depending on design requirements as is known in the art. The substrate 210 may also include other semiconductors such as germanium, silicon carbide (SiC), silicon germanium (SiGe), or diamond. Alternatively, the substrate 210 may include a compound semiconductor and/or an alloy semiconductor. Further, in some embodiments, the substrate 210 may include an epitaxial layer (epi-layer), the substrate 210 may be strained for performance enhancement, the substrate 210 may include a silicon-on-insulator (SOI) structure, and/or the substrate 210 may have other suitable enhancement features.

The method 100 proceeds to block 104 where a first source/drain region and a core channel region are formed in the substrate. Referring to the example of FIG. 3, in some embodiments of block 104, a first source/drain region 310 and a core channel region 320 are formed in the substrate 210. In some embodiments, the core channel region 320 may include the same material as the substrate 210, such as when the substrate 210 includes a high-mobility material. A high-mobility material is a material that has a higher mobility than that of silicon. High-mobility materials include silicon germanium (SiGe), indium arsenide (InAs), indium antimonide (InSb), or other suitable materials. Because such high-mobility semiconductor materials have a smaller bandgap between the conduction band and the valence band, such materials may exhibit more leakage current, even though such materials may provide good on-state performance. In some embodiments, the core channel region 320 may include a high-mobility material grown (e.g., by an epitaxial growth process) over the substrate 210, where the substrate 210 includes a material different from the core channel region 320 material. In some embodiments, the first source/drain region 310 may be formed by a well-known process, such as one or more of a photolithography process, an ion implantation process, an annealing process, a diffusion process, an epitaxial growth process, and/or other process known in the art.

In some other embodiments, the first source/drain region 310 and the core channel region 320 may be formed in a variety of ways. For example, in the case of the planar transistor device, the first source/drain region and the core channel region may be formed by doping a region of the substrate with the appropriate type of dopant. The appropriate type of dopant depends on the type of transistor. In the case of a finFET (fin Field Effect Transistor), the core channel region is formed as a fin structure. In the case of a nanowire transistor, the core channel region is formed as part of the nanowire structure. In some examples, the first source/drain region may be formed using an epitaxial process. For example, the region where the first source/drain region is to be formed can be removed using a removal process such as an etching process. The first source/drain region can then be epitaxial grown within the recess formed by the removal process. In some examples, the first source/drain region can be doped in-situ.

The core channel region 320 has first dopants, and the first source/drain region 310 has third dopants having the same conductivity type as the first dopants. In some embodiments, in which the semiconductor device is an n-type transistor, the first and third dopants are p-type dopants. In some embodiments, in which the semiconductor device is a p-type transistor, the first and third dopants are n-type dopants. The first source/drain region 310 and core channel region 320 may be moderately doped. The doping concentration of the first source/drain region 310 is lower than that of the core channel region 320. For example, the first source/drain region 310 may have a doping concentration ranging from about $1\times10^{17}/cm^3$ and about $5\times10^{20}/cm^3$, and the core channel region 320 may have a doping concentration ranging from about $5\times10^{18}/cm^3$ and about $1\times10^{21}/cm^3$.

The method 100 proceeds to block 106 where a barrier layer is formed in the substrate and adjacent the core channel region. Referring to the example of FIG. 4, in some embodiments of block 106, the substrate 210 is patterned and etched. In some embodiments, the substrate 210 may be patterned by photolithography or e-beam lithography. For example, the photolithography process may include forming a photoresist layer (resist) 410 overlying the substrate 210, exposing the resist 410 to a pattern, performing post-exposure bake processes, and developing the resist 410 to form a masking element including the resist 410. In some embodiments, patterning the resist 410 to form the making element may be performed using an electron beam (e-beam) lithography process. The masking element may then be used to protect regions of the substrate 210 while an etch process forms a recess 212 into the substrate 210. The etching used to form the recess 212 may include a dry etch (e.g., RIE, ICP), wet etch, or other suitable process.

Figure 5:
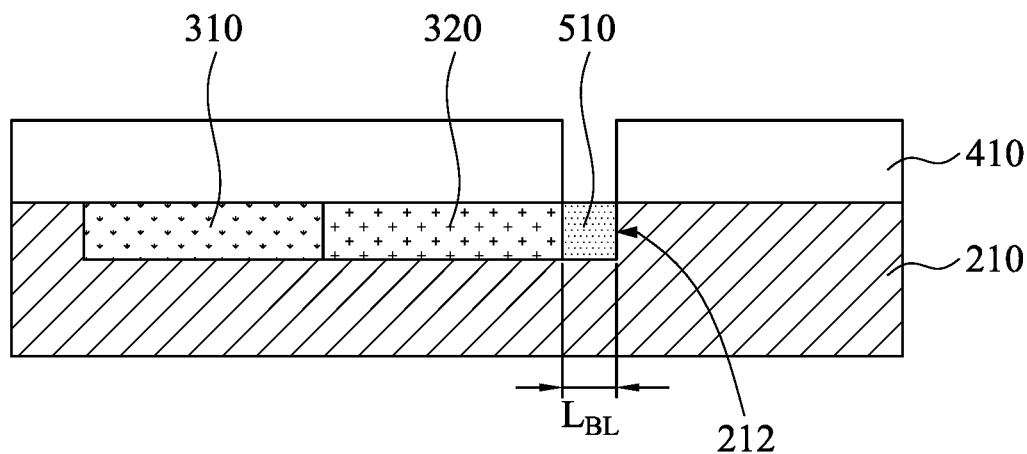

Referring to the example of FIG. 5, in some embodiments of block 106, a barrier layer 510 is formed in the recess 212, i.e., in the substrate 210 and adjacent the core channel region 320. In some embodiments, a barrier layer 510 is regrown within the recess 212. In various embodiments, the barrier layer 510 is regrown using an epitaxial growth process such as molecular beam epitaxy (MBE), metalorganic chemical vapor deposition (MOCVD), and/or other suitable regrowth process. By way of example, the regrown barrier layer 510 may include any of a plurality of semiconductor materials such as SiGe, strained Ge, Ge, GaAs, GaP, InP, InAs, InSb, GaAsP, InAlAs, AlGaAs, InGaAs, GaInP, and/or GaInAsP, or combinations thereof.

It should be noted for clarity of discussion that the regrown barrier layer 510 may include a material having a different composition than a composition of the core channel region 320. Moreover, the regrown barrier layer 510 may include a material having a different band gap than a band gap of the material used for the core channel region 320. For example, the barrier layer 510 includes a material having a larger band gap than a material of the core channel region 320. Thus, a heterojunction is formed at a barrier layer/core channel region interface. The heterojunctions at the barrier layer/core channel region interface result in band-offsets (e.g., conduction and/or valence band-offset) at the interface, which will impact the source-drain current flow through the core channel region 320. In some embodiments, the band-offset at the interface results in a suppressed and/or significantly decreased BTBT (band-to-band tunneling) current in order to minimize leakage current in the off-state. In some embodiment, the barrier layer 510 includes the same material as the core-channel region 320 but with an opposite type doping concentration in order to create the valence energy band offset (for an N-type device) or the conduction energy band offset (for a P-type device) between the core channel and the barrier region to suppress leakage. In some embodiments, the barrier layer 510 includes oxide material such as $SiO_2$, $HfO_2$, $Al_2O_3$, $ZrO_2$, oxidized AlSb, or other suitable materials. The length $L_{BL}$ of the barrier layer 510 is adjusted to minimize the leakage, the longer length $L_{BL}$ the lower the leakage in a given material system. In some embodiments, the length $L_{BL}$ of the barrier layer 510 is about 20 nm to about 35 nm.

The method 100 proceeds to block 108 where the barrier layer is doped. Referring to the example of FIG. 6, in some embodiments of block 108, the barrier layer 510' is doped with second dopants having the same conductivity type as the first dopants. For example, the barrier layer 510' may be in-situ doped during the epitaxial growth process. Alternatively, the barrier layer 510' may be doped after the formation of the barrier layer 510 of FIG. 5. In the case of an N-type transistor, the barrier layer 510' may be highly doped with P-type dopants. For example, the P-type dopant is Zn if the barrier layer 510' is made of GaSb, and the P-type dopant is C if the barrier layer 510' is made of GaAs. In the case of a P-type transistor, the barrier layer 510' may be highly doped with N-type dopants. For example, the N-type dopant is S (Se and Sn may also be used) if the barrier layer 510' is made of InAs, and the N-type dopant is Si if the barrier layer 510' is made of GaAs. In some embodiments, the doping concentration of the barrier layer 510' is lower than or equal to that of the core channel region 320. In other embodiments, the doping concentration of the barrier layer 510' may be higher than the doping concentration of the first source/drain region 310. In certain embodiments, the doping concentration of the barrier layer 510' may have substantially the same value as the doping concentration of the first source/drain region 310. In one embodiment, the doping concentration of the barrier layer 510' may be lower than the doping concentration of the first source/drain region 310. In another embodiment, the barrier layer 510' can be doped with the opposite conductivity type as of the core channel region 320.

Figure 6:
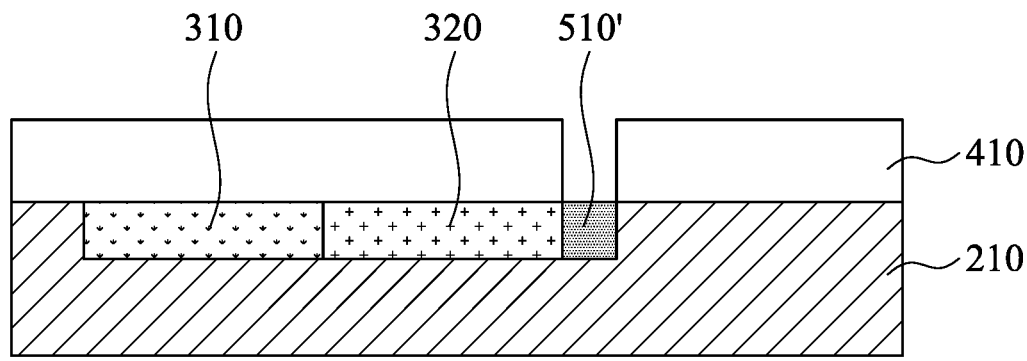

The method 100 proceeds to block 110 where a shell is formed on the core channel region and the barrier layer. Referring to the example of FIG. 7, in some embodiments of block 110, another recess 214 is formed in the substrate 210. Specifically, after the barrier layer 510 (or 510') is formed, the resist 410 of FIG. 6 is removed. Another resist 710 is formed over the substrate 210 to cover the first source/drain region 310, the core channel region 320, and the barrier layer 510'. An opening 712 is formed in the resist 710. The opening 712 exposes a portion of the substrate 210 which is adjacent the barrier layer 510'. An etching process is performed to remove the exposed portion of the substrate 210, and the recess 214 is formed in the substrate 210.

Figure 7:
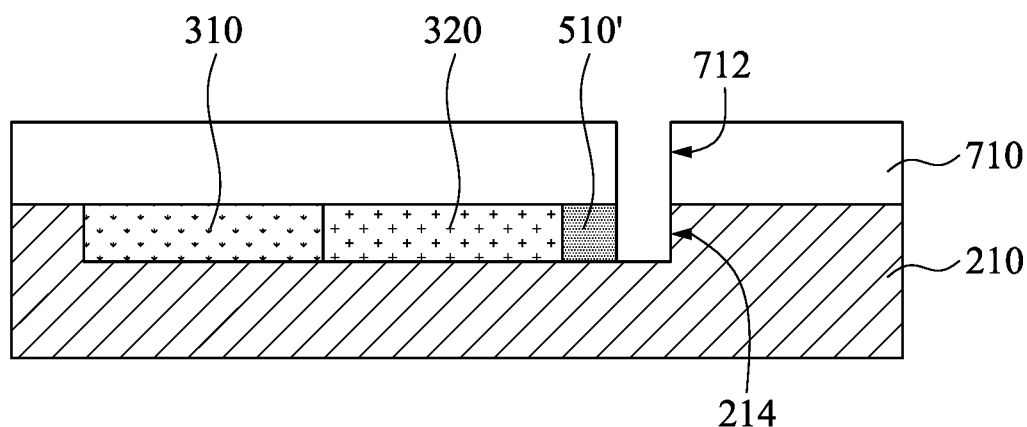
Figure 8:
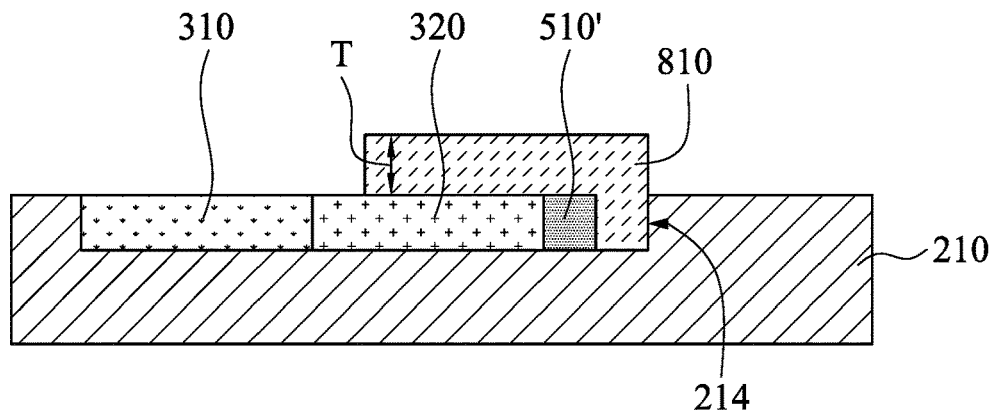
Figure 9:
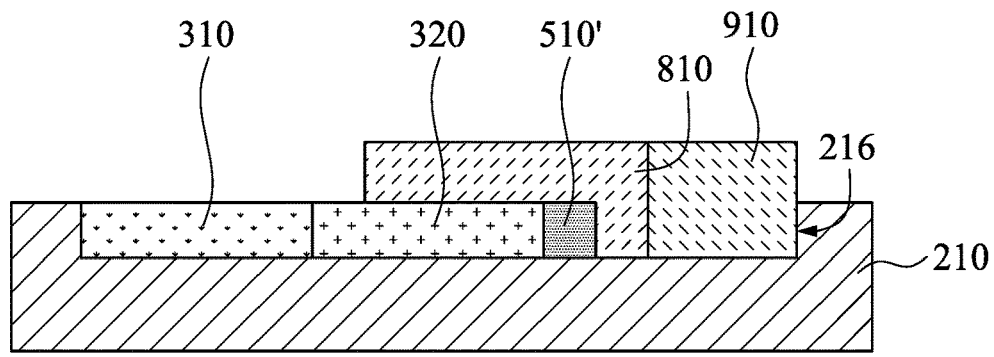
Figure 10:
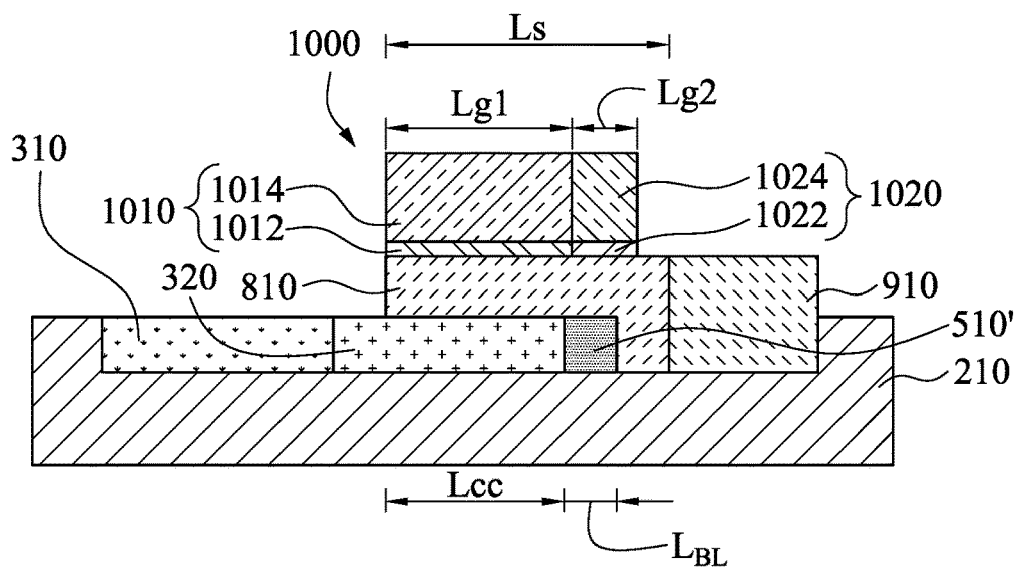

Referring to the example of FIG. 8, in some embodiments of block 110, a shell 810 is formed. Specifically, the resist 710 of FIG. 7 is removed, and a semiconductor material is formed to replace the space left by the resist 710. The semiconductor material fills in the recess 214 in the substrate 210 and over-fills on the top surface of the first source/drain region 310, the core channel region 320, and barrier layer 510'. The semiconductor material is attached to the top surface and one side of the barrier layer 510'. The semiconductor material may include a different material from the core channel region 320, and the semiconductor material may be intrinsic or doped. In some embodiment the material of the shell 810 may use the same material as the material of the core channel region 320 but using the opposite doping conductivity type than the material of the core channel region 320 in order to create a PN junction.

The semiconductor material is then patterned to be the shell 810. The shell 810 forms an L shape block over the core channel region 320 and the barrier layer 510'. One leg of the shell 810 rests on the top surface of the core channel region 320 and barrier layer 510'. The other leg of the shell 810 stands on the substrate 210 and covers the other side of the barrier layer 510'. The turning corner of the shell 810 rests on the corner of the barrier layer 510'. In some embodiments, a thickness T of the shell 810 is in a range of about 1 nm to about 7 nm.

The method 100 proceeds to block 112 where a second source/drain region is formed adjacent the shell. Referring to the example of FIG. 9, in some embodiments of block 112, another recess 216 is formed in the substrate 210 and adjacent the shell 810. Then, a second source/drain region 910 is formed in the recess 216 and adjacent the shell 810. In some embodiments, the second source/drain region 910 includes diffused source/drain regions, ion implanted source/drain regions, epitaxially grown regions, or a combination thereof. The second source/drain region 910 may have the same material as the shell 810 while the second source/drain region 910 is doped.

In some embodiments, selection of a material for each of the core channel region 320, the barrier layer 510 (510'), the first source/drain region 310, the shell 810, and the second source/drain region 910 depends on whether the semiconductor device is implemented as an N-type or P-type device. Further, the materials may present an adequate staggered or broken gap configuration between core and shell in the core channel region 320. By way of example, the barrier layer 510 (510') may include at least one of GaAs, AlSb, InGaAs, InAlAs, GaSb, Si, or SiGe for N-type devices, and the barrier layer 510' may include at least one of GaAs, AlSb, InGaAs, InAlAs, Si, SiGe, InP, or InAs for P-type devices. Merely for purposes of illustration, exemplary combinations of materials, used in a given N- or P-type devices, for each of the barrier layer 510', the core channel region 320, the first source/drain region 310, the shell 810, and the second source/drain region 910 are provided below. In some examples, for P-type devices, the barrier layer 510' includes GaAs, AlSb, or InGaAs, the core channel region 320 and first source/drain region 310 include InAs, and the shell 810, and the second source/drain region 910 include GaSb. In other examples, for P-type devices, the barrier layer 510' includes InAlAs, the core channel region 320 and first source/drain region 310 include InGaAs, and the shell 810, and the second source/drain region 910 include GaAsSb. In yet other examples, for P-type devices, the barrier layer 510' includes GaAs, AlSb, or InGaAs, the core channel region 320 and first source/drain region 310 include InAs, and the shell 810, and the second source/drain region 910 include InAs. In still other examples, for N-type transistors, the barrier layer 510' includes AlSb, InAlSb, GaAs or InGaAs, the core channel region 320 and first source/drain region 310 include GaSb, GaAsSb or InGaSb and the shell 810, and the second source/drain region 910 include InAs, InGaAs or InSb. In yet other examples, for N-type devices, the barrier layer 510' includes Si or SiGe, the core channel region 320 and first source/drain region 310 include Ge, and the shell 810, and the second source/drain region 910 include Si. In some embodiments, for P-type transistors, the barrier layer 510' includes Si, SiGe, or InP, the core channel region 320 and first source/drain region 310 include Ge, and the shell 810, and the second source/drain region 910 include Si.

The method 100 proceeds to block 114 where a gate stack is formed on the shell. Referring to the example of FIG. 10, in some embodiments of block 114, a gate stack 1000 is formed on the shell 810. The gate stack 1000 includes a first gate 1010 over the core channel region 320 and a second gate 1020 over the barrier layer 510'. That is, the first gate 1010 is at least partially aligned with the core channel region 320, and the second gate 1020 is at least partially aligned with the barrier layer 510'. The first gate 1010 includes a gate dielectric layer 1012 and a variety of first metal layers 1014. The second gate 1020 includes the gate dielectric layer 1022 and a variety of second metal layers 1024.

In some embodiments, the first gate 1010 and the second gate 1020 are formed using a gate-first process. Alternatively, in some examples, the first gate 1010 and the second gate 1020 are formed using a gate-last process. In some examples, a gate-first process includes formation of a gate stack prior to source/drain formation or source/drain dopant activation. Merely by way of example, a gate-first process may include gate dielectric and gate depositions, followed by a gate stack etch process to define a gate critical dimension (CD). In some embodiments of a gate-first process, gate stack formation may be followed by source/drain formation including doping of source/drain regions and, in some examples, annealing for source/drain dopant activation. In some examples, a gate-late process includes forming a dummy gate stack that will be replaced by a final gate stack at a subsequent processing stage of the semiconductor device. For example, a dummy gate stack may be replaced at a later processing stage by a high-K dielectric layer (HK) and metal gate electrode (MG).

The gate dielectric layers 1012 and 1022 may be high-K gate dielectrics, as used and described herein, including dielectric material having a high dielectric constant, for example, greater than that of thermal silicon oxide (~3.9). The gate dielectric layers 1012 and 1022 may be the same or different material(s). The metal layer used within the first gate 1010 and the second gate 1020 may include a metal, metal alloy, or metal silicide. Additionally, the formation of the first gate 1010 and the second gate 1020 include depositions to form various gate materials and one or more CMP processes to remove excessive gate materials and thereby planarize a top surface of the semiconductor device.

In some embodiments, each of the first gate 1010 and the second gate 1020 includes an interfacial layer between the shell 810 and the gate dielectric layer 1012 (1022). By way of example, the interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layers 1012 and 1022 may include a high-K dielectric layer such as hafnium oxide ($HfO_2$). Alternatively, the gate dielectric layers 1012 and 1022 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layers 1012 and 1022 may be formed by ALD, physical vapor deposition (PVD), CVD, oxidation, and/or other suitable methods. The metal layers 1014 and 1024 may include a single layer or alternatively a multilayer structure, such as various combinations of a metal layer with a selected work function to enhance the device performance (work function metal layer), liner layer, wetting layer, adhesion layer, metal alloy or metal silicide. By way of example, the metal layers 1014 and 1024 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. The metal layers 1014 and 1024 may be formed by ALD, PVD, CVD, e-beam evaporation, or other suitable process. Further, the metal layers 1014 and 1024 may be formed separately for N-FET and P-FET transistors which may use different metal layers. In various embodiments, a CMP process may be performed to remove excessive metal from the metal layers 1014 and 1024, and thereby provide a substantially planar top surface of the metal layers 1014 and 1024.

In some examples, the gate stack 1000 may be formed on a single side of the core channel region 320. In some examples, the gate stack 1000 may be positioned on more than one side of the core channel region 320. The first gate 1010 is positioned such that it covers the core channel region 320. In some examples, however, the core channel region 320 may extend slightly beyond the first gate 1010. In some examples, the first gate 1010 may extend slightly beyond the core channel region 320. The second gate 1020 is positioned such that it covers the barrier layer 510'. In some examples, however, the barrier layer 510' may extend slightly beyond the second gate 1020. In some examples, the second gate 1020 may extend slightly beyond the barrier layer 510'.

The work functions of the first gate 1010 and the second gate 1020 are different. For example, for an N-type device, the work function of the first gate 1010 is smaller than the work function of the second gate 1020; for a P-type device, the work function of the first gate 1010 is greater than the work function of the second gate 1020. In some embodiments, the equivalent oxide thickness (EOT) of the second gate 1020 is smaller than that of the first gate 1010. EOT is a distance, usually given in nanometers, which indicates how thick a silicon oxide film would need to be to produce the same effect as a high-k material being used.

In some embodiments, a portion of the core channel region 320 covered by the gate stack 1000 has a length Lcc in a range of about 3 nm to about 100 nm, and the barrier layer 510' has the length LBL in a range of about 5 nm to about 50 nm. The first gate 1010 has a length Lg1 in a range of about 3 nm to about 105 nm, and a length ratio of the first gate 1010 and the core channel region 320 is in a range of about 0.7 to about 1.3. The second gate 1020 has a length Lg2 in a range of about 5 nm to about 55 nm. A length ratio of the second gate 1020 and the barrier layer 3510' is in a range of about 0.7 to about 1.3.

Figure 11:
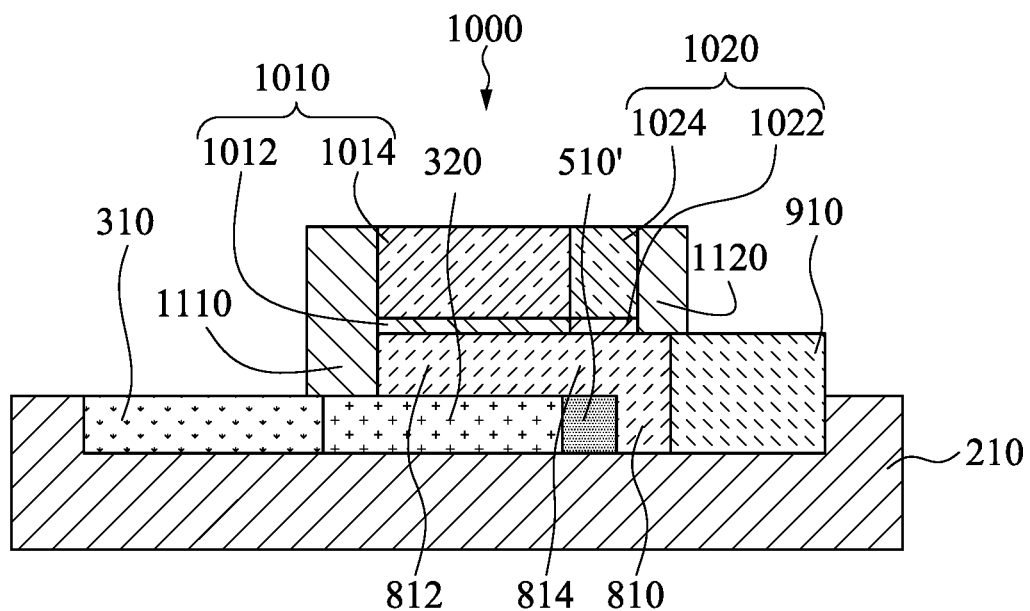

The method 100 proceeds to block 116 where spacers are formed on sidewalls of the gate stack. Referring to the example of FIG. 11, in some embodiments of block 116, spacers 1110 and 1120 are formed on sidewalls of the gate stack 1000. In some embodiments, spacers 1110 and 1120 are made of low-k dielectric materials. For example, the low-k dielectric material is blanket deposited on the substrate 210. The low-k dielectric material is then patterned to remove excess portion on the top surfaces of the gate stack 1000. The spacers 1110 and 1120 may not be in the same thickness. As shown in FIG. 11, the spacer 1110 at the first source/drain region 310 has a larger thickness because it stands on the level same as the substrate 210. The thickness of the spacer 1110 is measured of the combined thickness of the shell 810 and the first gate 1010. The spacer 1120 at the second source/drain region 910 is shorter because it stands on the shell 810. The thickness of the spacer 1120 is measured of the thickness of the second gate 1020. In some embodiments, the spacer 1110 stands on a portion of the core channel region 320 and may on a portion of the first source/drain region 310, and the spacer 1120 stands on the shell 810 and a portion of the second source/drain region 910. In some embodiments, the spacer 1120 at the second source/drain region 320 may be omitted.

The semiconductor device may undergo further processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 12:
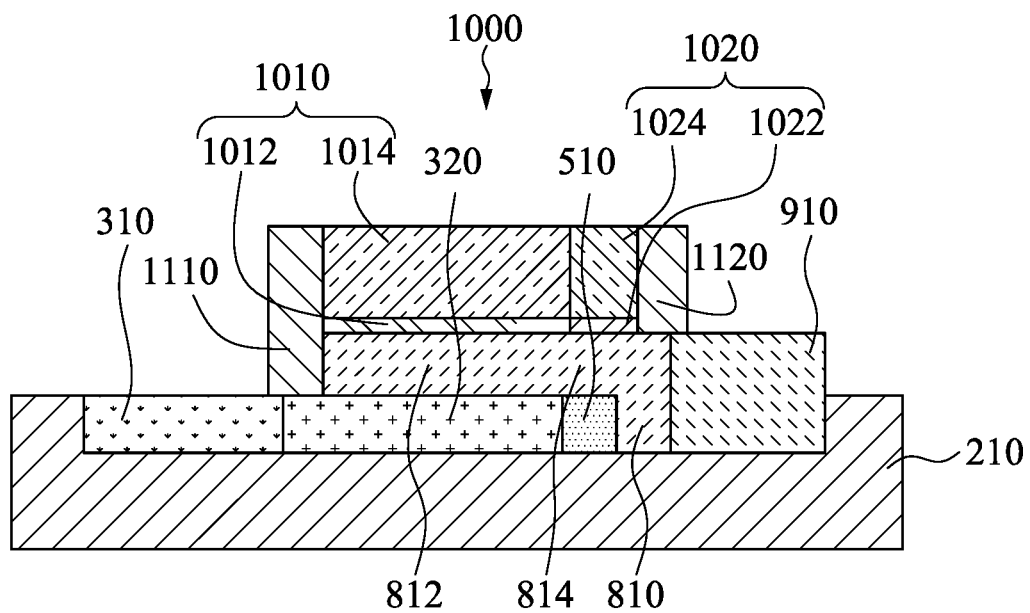
FIGS. 12-13 illustrate semiconductor devices in accordance with some embodiments of the present disclosure.
Figure 21:
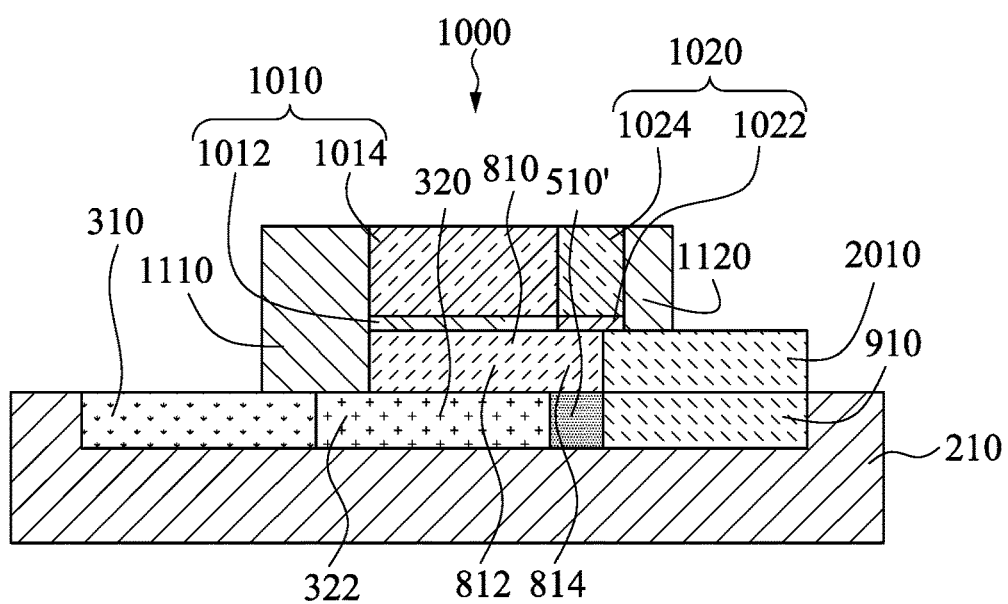
Figure 22:
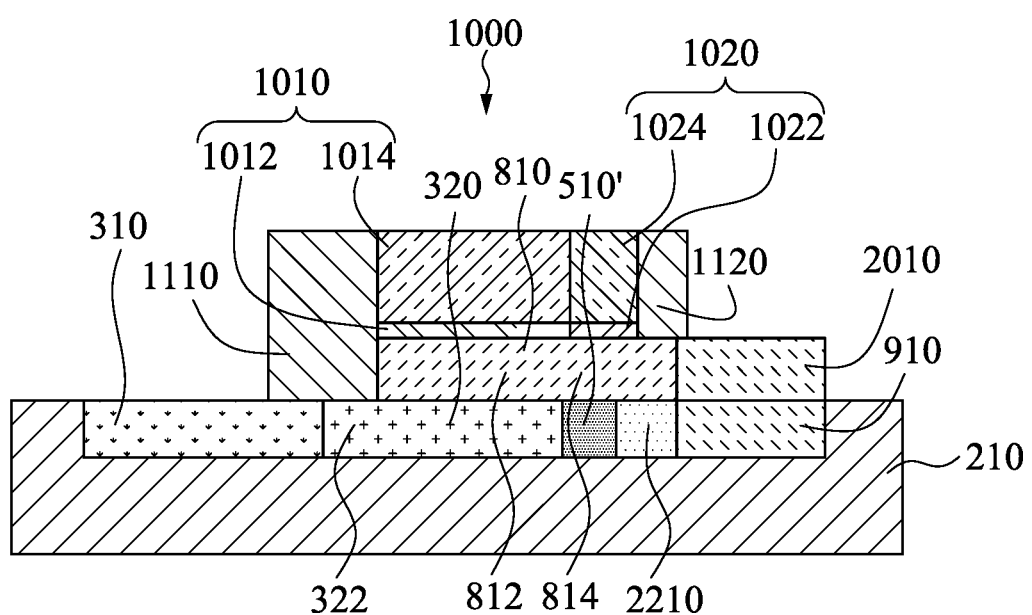
FIG. 22 illustrates a semiconductor device in accordance with some embodiments of the present disclosure.

Moreover, additional process operations may be implemented before, during, and after the method 100, and some process operations described above may be replaced or eliminated in accordance with various embodiments of the method 100. In some embodiments, for example, at least parts of the method 100 may be implemented to fabricate a device which includes the barrier layer 510. With reference to FIG. 12, illustrated therein is a schematic view of a semiconductor device which includes the barrier layer 510 at the drain side of the device. The operation 108 of method 100 is omitted in FIG. 12. That is, the barrier layer 510 is not doped. The second gate 1020 is formed over the barrier layer 510. The second gate 1020 is positioned such that it covers the barrier layer 510. In some examples, however, the barrier layer 510 may extend slightly beyond the second gate 1020. In some examples, the second gate 1020 may extend slightly beyond the barrier layer 510. In an alternative embodiment, the shell 810 is straight and extends between opposite edges of the core channel region 320 and an edge, i.e., one of opposite edges, of the barrier layer 510' (as shown in FIGS. 21 and 22).

The work functions of the first gate 1010 and the second gate 1020 are different. In an exemplary embodiment, for an N-type device, the work function of the first gate 1010 is smaller than the work function of the second gate 1020 by about 0.3 eV to about 0.6 eV or by more than 0.6 eV, e.g., 0.9 eV; for a P-type device, the work function of the first gate 1010 is greater than the work function of the second gate 1020 by about 0.2 eV to about 0.6 eV or by more than 0.6 eV, e.g., 0.9 eV. If the difference of the work functions is too small, e.g. smaller than about 0.2 eV, the band may not be aligned, and if the difference is too large, e.g. larger than about 0.6 eV, the off state current of the device may be degraded. In some embodiments, the EOT of the second gate 1020 is small, and may have a range of about 0.25 nm to about 10 nm. Further, the EOT of the second gate 1020 is smaller than that of the first gate 1010.

Figure 13:
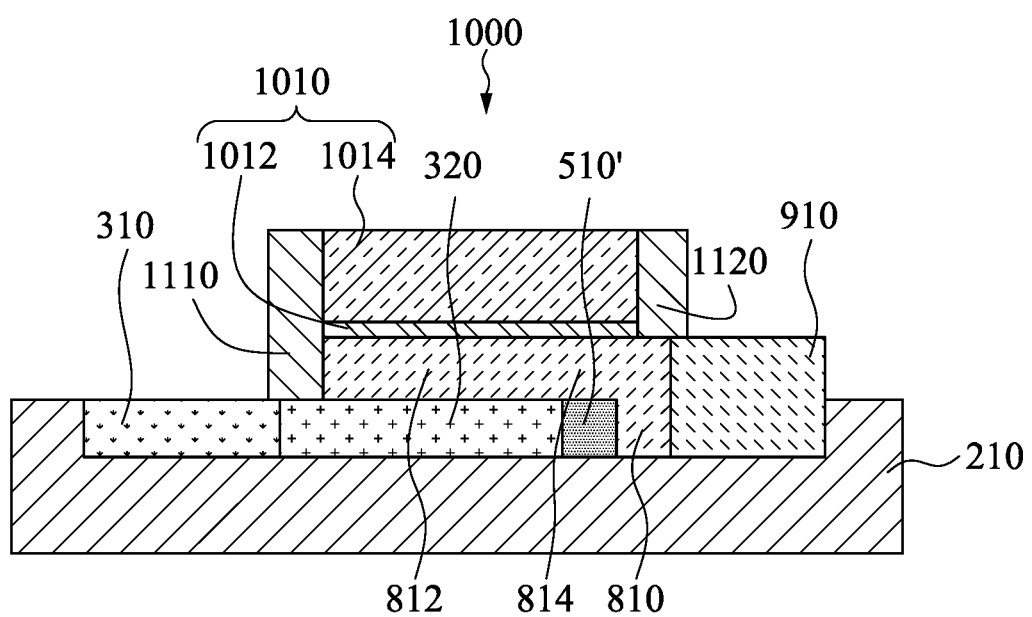

In some other embodiments, for example, at least parts of the method 100 may be implemented to fabricate a device which includes the barrier layer 510'. With reference to FIG. 13, illustrated therein is a schematic view of a semiconductor device which includes the barrier layer 510' at the drain side of the semiconductor device. The operation 114 of method 100 is different in FIG. 13. In FIG. 13, the first gate 1010 is formed over the core channel region 320 and the barrier layer 510'. The first gate 1010 is positioned such that it covers the barrier layer 510'. In some examples, however, the barrier layer 510' may extend slightly beyond the first gate 1010. In some examples, the first gate 1010 may extend slightly beyond the barrier layer 510'. In some embodiments, the barrier layer 510' may have a doping concentration greater than about $5\times10^{18}/cm^3$ (about $5\times10^{19}/cm^3$ for example), and the core channel region 320 may have a doping concentration that is about $1\times10^{20}/cm^3$. The first dopants of the core channel region 320 and the third dopants of the barrier layer 510' have the same conductivity type. In some embodiments, the doping concentration of the barrier layer 510' is higher than that of the first source/drain region 310 and lower than that of the core channel region 320.

Figure 14B:
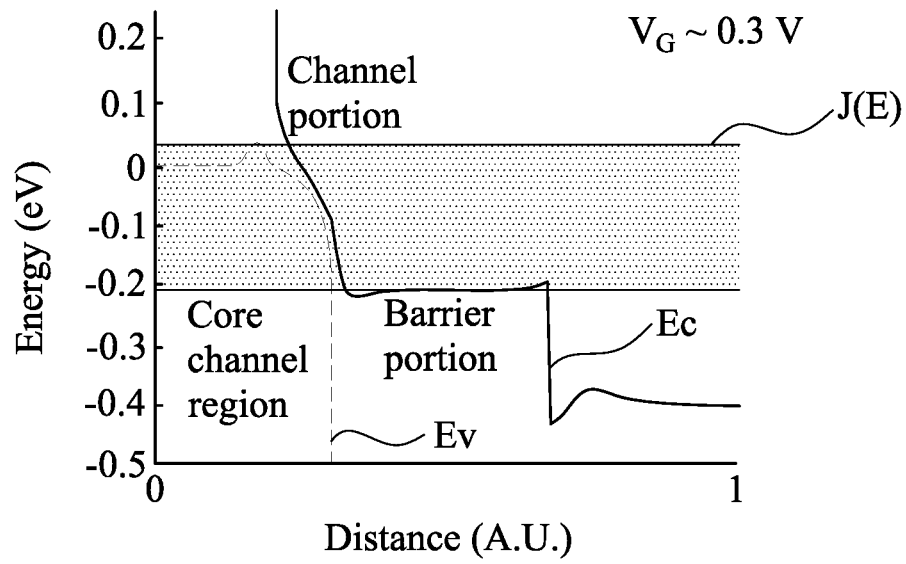

With such configuration, the semiconductor devices in FIGS. 11-13 enable high performance CMOS speed at $V_{DD}$ about 0.3V. Reference is further made to FIGS. 14A and 14B, which are energy band diagrams for the N-type semiconductor devices of FIGS. 11-13 respectively in off- and on-state. Ev is the valence band in the core channel region 320, Ec is the conduction band in the shell 810 and second source/drain region 910, and J(E) is the spectral current density. Specifically, as shown in the example of FIGS. 11-13, the semiconductor device may include dual gate (i.e., the first gate 1010 and the second gate 1020), and/or the semiconductor device may include the doped barrier layer 510'. Such configuration modulates the conduction energy bands of the shell 810 to achieve core/shell line tunneling which increases on state current of the semiconductor device. In greater detail, the shell 810 includes a channel portion 812 and a barrier portion 814. The channel portion 812 is on and in contact with the sidewall(s) of the core channel region 320 facing the first gate 1010, and the barrier portion 814 is on and in contact with the sidewall(s) of the barrier layer 510 (or 510') facing the second gate 1020. In various embodiments, the overlap of the second gate 1020 and the barrier layer 510 (or 510') provides electrostatic modulation (e.g., via voltage bias applied to the second gate 1020) at the barrier portion 814. Thus, by such electrostatic gate modulation, the conduction energy band of the barrier portion 814 may be tuned, such that the conduction band energy difference ΔE between the channel portion 812 and the barrier portion 814 can be reduced. In other words, the conduction energy band of the barrier portion 814 can be substantially aligned with the conduction energy band of the channel portion 812. In some embodiments, the conduction band energy difference ΔE is less than or equal to about 0.2 eV. In some other embodiments, the conduction band energy difference ΔE is less than or equal to about 0.1 eV. Also, the doped barrier layer 510' provides electrostatic modulation at the barrier portion 814, and thus achieving such alignment.

When the semiconductor device is switched from off-state ($V_G$ is about 0 V and referring to FIG. 14A) to on-state ($V_G$ is about 0.3 V and referring to FIG. 14B), conduction from the core channel region 320 to the barrier portion 814 occurs first. In this case, current flows from the core channel region 320 directly towards the barrier portion 814, and this conduction is called point tunneling. Subsequently, since the conduction band alignment of the channel portion 812 and the barrier portion 814, conduction from the core channel region 320 to the channel portion 812 occurs simultaneously or very shortly after the conduction from the core channel region 320 to the barrier portion 814. In this case, current further flows from the core channel region 320 towards the channel portion 812 and then to the barrier portion 814, and this conduction is called line tunneling. As such, the on-state current is increased with low power consumption (about 0.3V).

Figure 15:
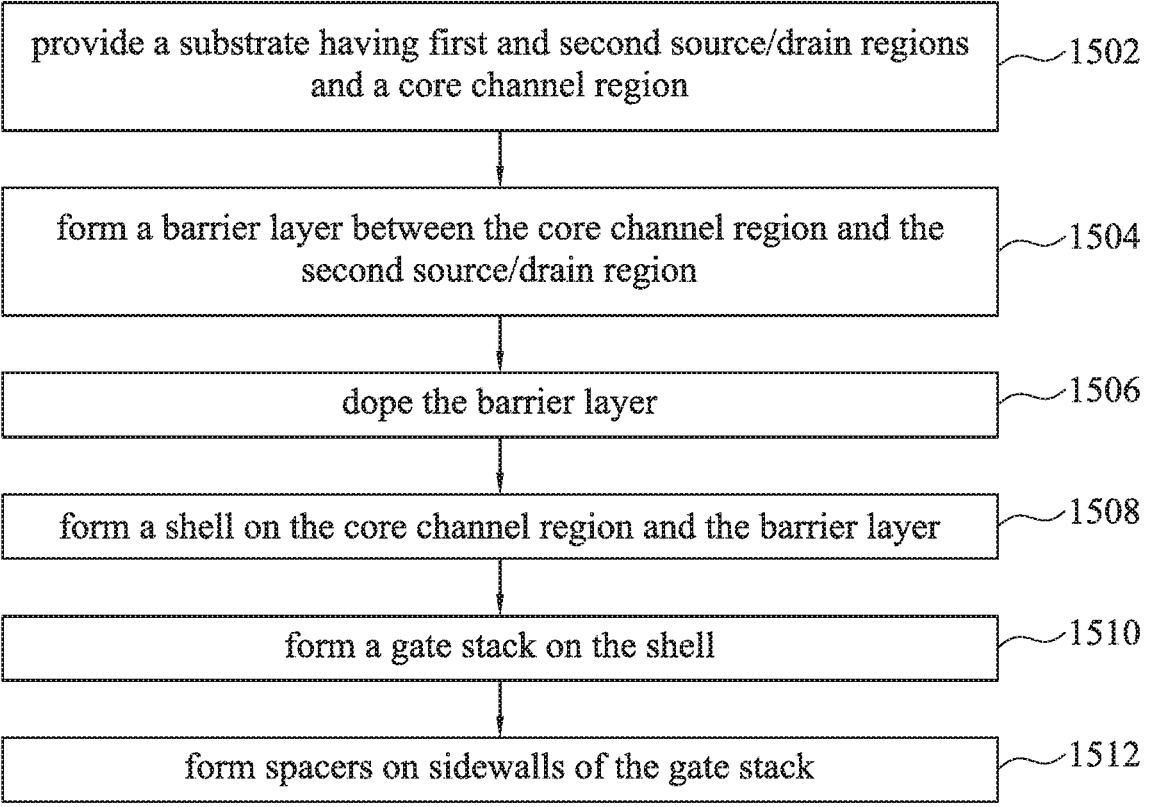
FIG. 15 is a flow chart of a method of manufacturing a semiconductor device in accordance with some embodiments of the present disclosure.

Illustrated in FIG. 15 is a flow chart of a method 1500 of manufacturing a semiconductor device in accordance with some embodiments of the present disclosure. FIGS. 16 to 21 illustrate a semiconductor device at various stages according to aspects of the method of FIG. 15. The method 1500 begins at block 1502 where a substrate is provided. Referring to the example of FIG. 16, in some embodiments of block 1502, a substrate 210 is provided. The substrate 210 may be a semiconductor substrate such as a silicon substrate. The substrate 210 is similar in many respects to those discussed above in association with the substrate 210 in FIG. 11.

Figure 16:
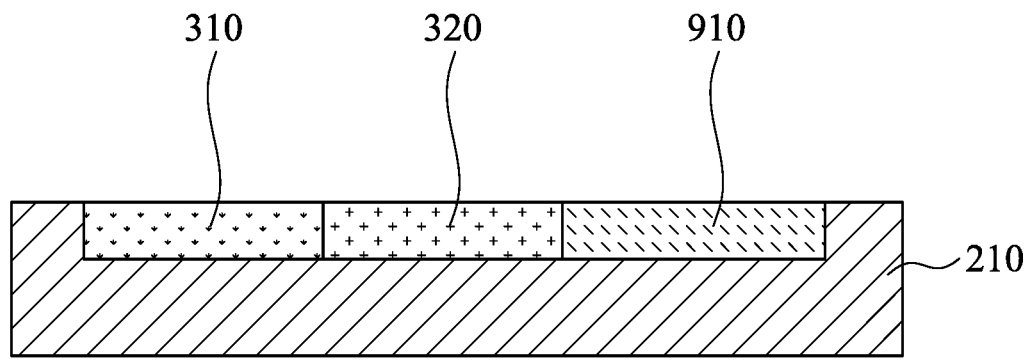
FIGS. 16 to 21 illustrate a semiconductor device at various stages according to aspects of the method of FIG. 15.
Figure 17:
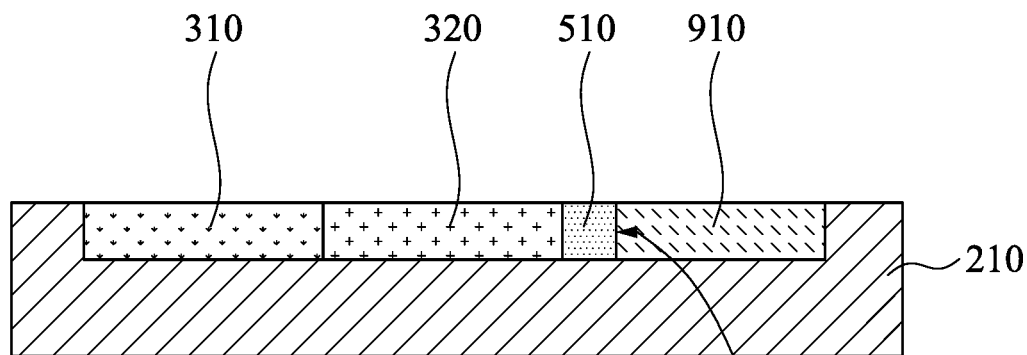
Figure 18:
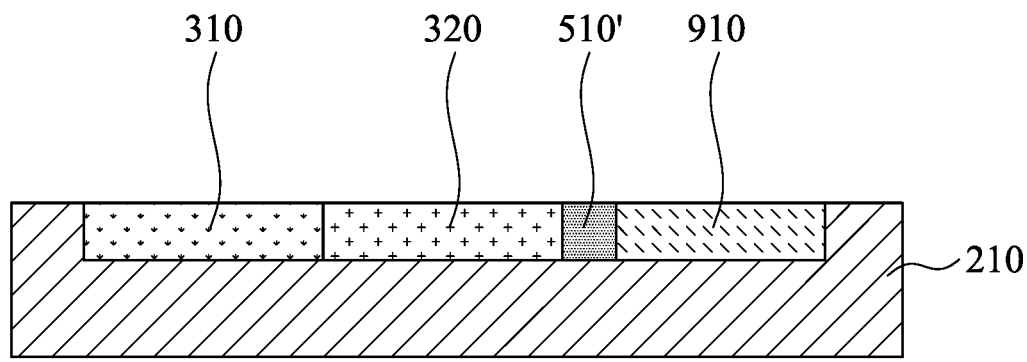
Figure 19:
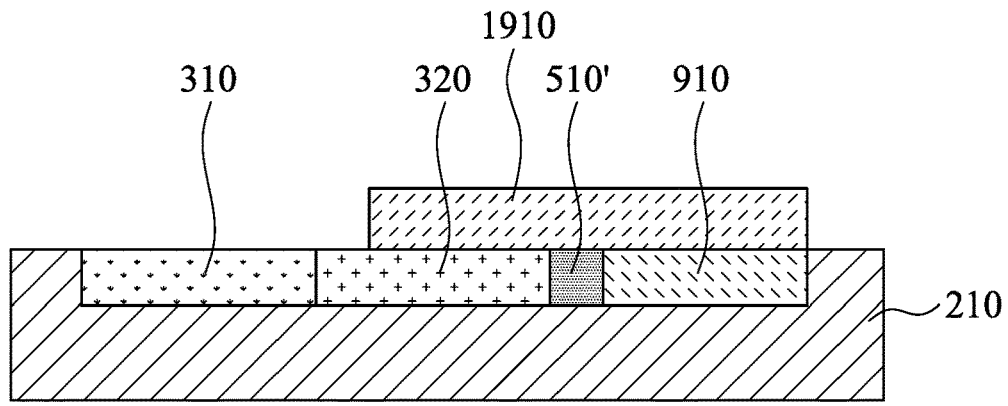

A first source/drain region 310, a second source/drain region 910, and a core channel region 320 are formed in the substrate 210. The first source/drain region 310, the second source/drain region 910, and the core channel region 320 in FIG. 16 are similar in many respects to those discussed above in association with the first source/drain region 310, the second source/drain region 910, and the core channel region 320 in FIG. 11.

The method 1500 proceeds to block 1504 where a barrier layer is formed between the core channel region and the second source/drain region. Referring to the example of FIG. 17, in some embodiments of block 1504, a barrier layer 510 is formed between the core channel region 320 and the second source/drain region 910. For example, the second source/drain region 910 is patterned to form a recess 218 therein, and the barrier layer 510 is grown in the recess 218. That is, the barrier layer 510 is in contact with the second source/drain region 910. The barrier layer 510 is similar in many respects to those discussed above in association with the barrier layer 510 in FIG. 5.

The method 1500 proceeds to block 1506 where the barrier layer is doped. Referring to the example of FIG. 18, in some embodiments of block 1506, the barrier layer 510' is doped with second dopants. The barrier layer 510' is similar in many respects to those discussed above in association with the barrier layer 510' in FIG. 11.

The method 1500 proceeds to block 1508 where a shell is formed on the core channel region and the barrier layer. Referring to the example of FIG. 19, in some embodiments of block 1508, a semiconductor material 1910 is formed over the structure of FIG. 18. The semiconductor material 1910 is similar in many respects to those discussed above in association with the semiconductor material in FIG. 8.

Figure 20:
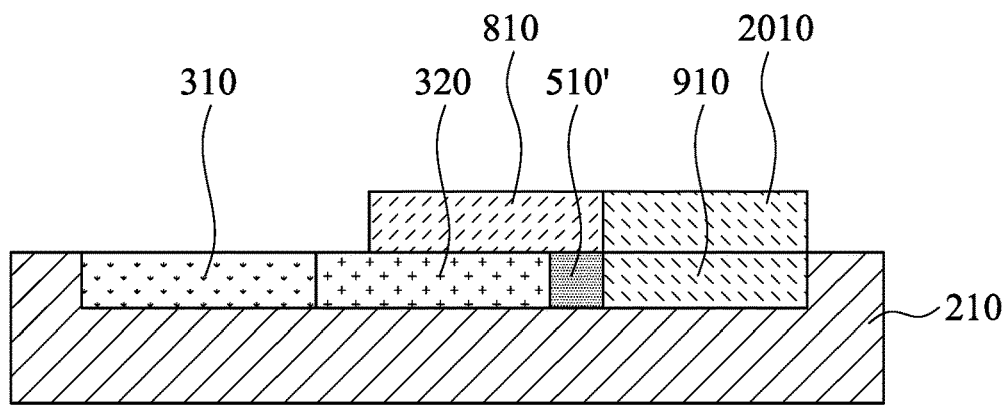

Reference is made to FIG. 20. A portion of the semiconductor material 1910 on the second source/drain region 910 is doped to form a doped region 2010 which has the same conductivity type and similar doping concentration as the second source/drain region 910. The doped region 2010 and the second source/drain region 910 form a drain of the semiconductor device. The remained semiconductor material forms a shell 810. The shell 810 is similar in many respects to those discussed above in association with the shell 810 in FIG. 11.

The method 1500 further proceeds to blocks 1510 and 1512 and FIG. 21. Since the formation of the gate stack 1000 and the spacers 1110 and 1120 are similar to that of the gate stack 1000 and the spacers 1110 and 1120 mentioned above, and thus a description thereof is omitted. In FIG. 21, the shell 810 includes a channel portion 812 and a barrier portion 814. The doping of the barrier layer 510' and/or the first and second gate configuration provide electrostatic modulation at the barrier portion 814 to align the energy bands of the channel portion 812 and the barrier portion 814.

In some embodiments, the operation 1506 is omitted. That is, the barrier layer 510 is not doped, and the gate stack 1000 including first and second gates 1010 and 1020 provides electrostatic modulation. In some other embodiments, the gate stack 1000 is without the second gate 1020, and the barrier layer 510' which has the same conductivity type of dopants as the core channel region 320 provides electrostatic modulation. In still some other embodiments, the barrier layer 510' and the core channel region 320 have opposite conductivity types of dopants to suppress current leakage, and the gate stack 1000 including first and second gates 1010 and 1020 provides electrostatic modulation.

In some embodiments, a portion 322 of the core channel region 320 uncovered by the gate stack 1000 has the same doping concentration as the first source/drain region 310 before forming the spacer 1110. That is, the edge of the core channel region 320 is aligned with the edge of the gate stack 1000. The portion 322 is then further doped using the gate stack 1000 as a mask to extend the core channel region 320.

With reference to FIG. 22, illustrated therein is a schematic view of a semiconductor device which includes a semiconductor material 2210 between the barrier layer 510' (or 510) and the second source/drain region 910. In FIG. 22, the semiconductor material 2210 may have the same material as the second source/drain region 910 but with a lower doping concentration than the second source/drain region 910. In some embodiments, the semiconductor material 2210 is intrinsic. In some other embodiments, the semiconductor material 2210 is doped with the same conductivity type dopants as the second source/drain region 910. The dopant distribution in the semiconductor material 2210 may be uniform or nonuniform. For example, the dopant concentration of the semiconductor material 2210 increases in the direction from the barrier layer 510' towards the second source/drain region 910. The semiconductor material 2210 reduces ambipolar leakage current in the off-state of the semiconductor device.

Figure 23:
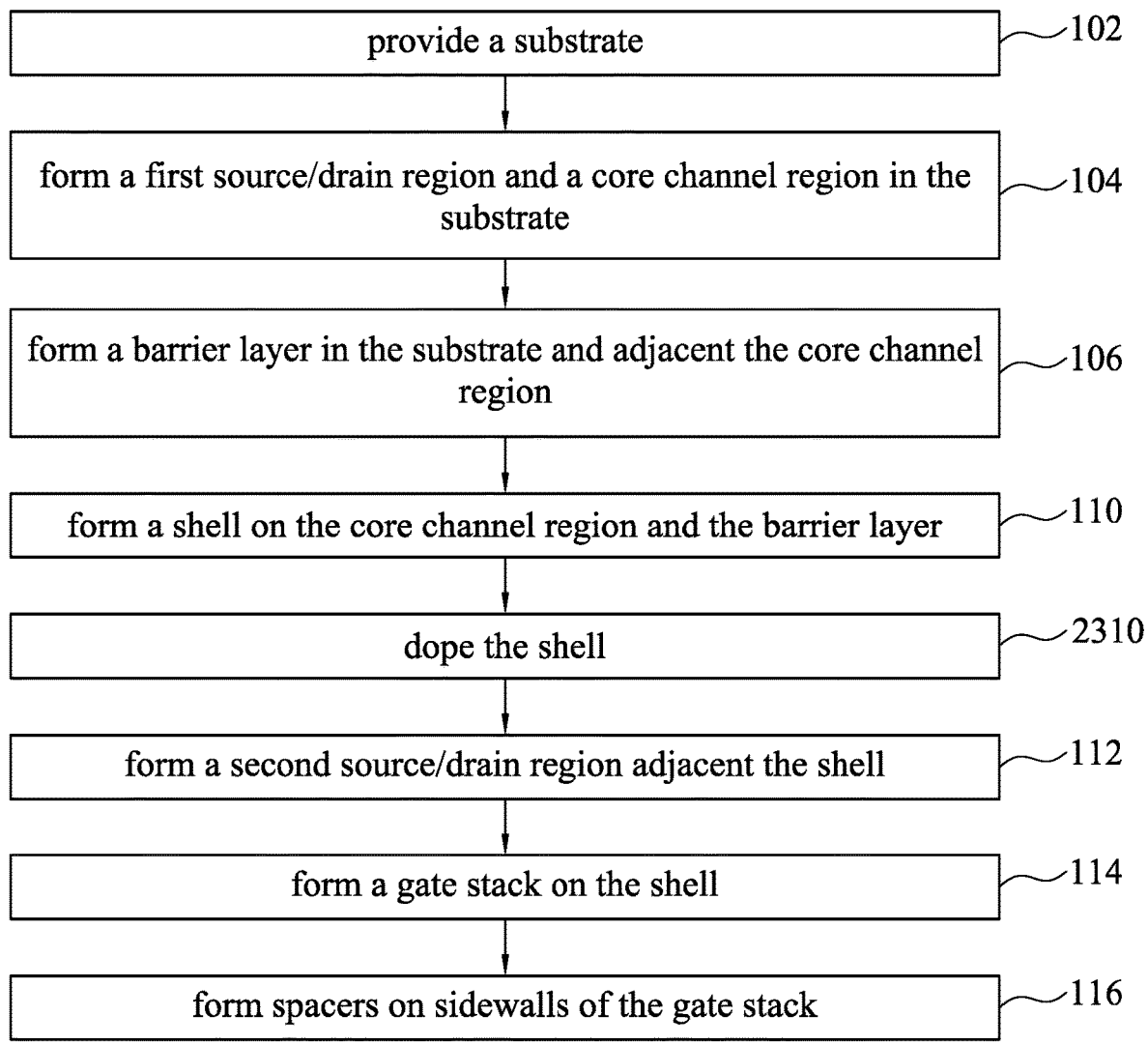
FIG. 23 is a flow chart of a method of manufacturing a semiconductor device in accordance with some embodiments of the present disclosure.
Figure 24:
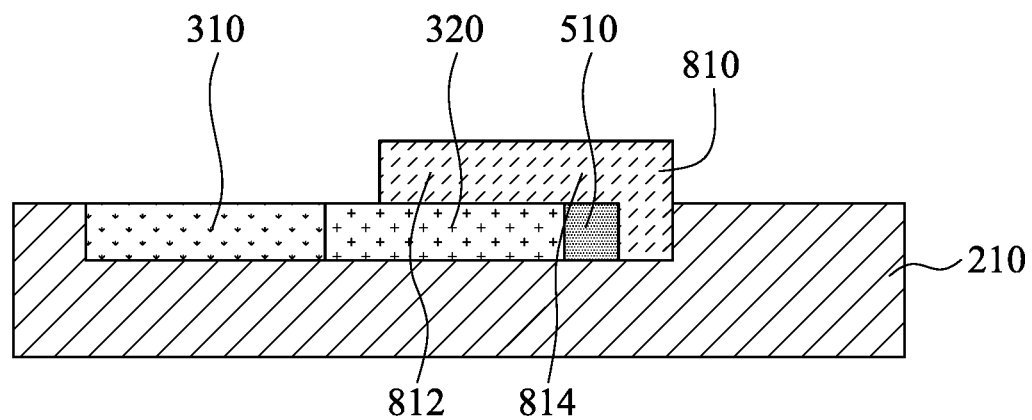
FIGS. 24 to 25 illustrate a semiconductor device at various stages according to aspects of the method of FIG. 23.
Figure 25:
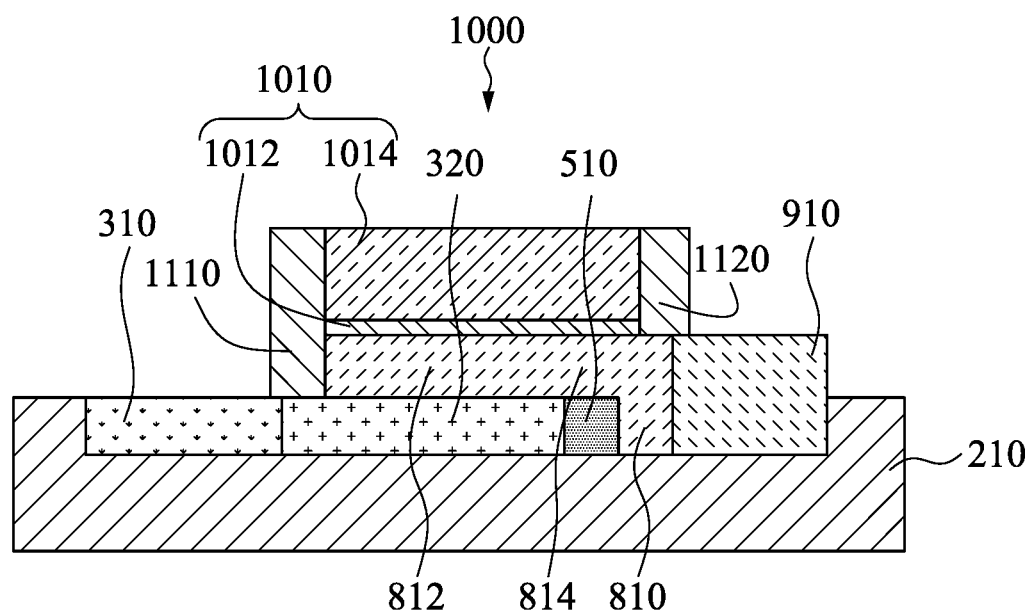

FIG. 23 is a flow chart of a method of manufacturing a semiconductor device in accordance with some embodiments of the present disclosure. FIGS. 24-25 illustrate a semiconductor device at various stages according to aspects of the method of FIG. 23. As shown in FIG. 23, the method 100 omits the operation 108 (see FIG. 1) and further includes an operation 2310. In some embodiments, the operation 2310 may be performed between the operations 110 and 112.

In some embodiments, the manufacturing processes of operations 102 to 106 and 110 are performed in advance. Since the relevant manufacturing details are similar to FIGS. 2-5 and 7-8, and, therefore, a description in this regard will not be repeated hereinafter. The method 100 proceeds to block 2310 where the shell is doped. Referring to the example of FIG. 24, in some embodiments of block 2310, the shell 810 is doped. In some embodiments, the channel portion 812 and/or the barrier portion 814 may be doped to modulate the band level thereof, and the present disclosure is not limited in this respect. The channel portion 812 is doped with fourth dopants, and the barrier portion 814 is doped with fifth dopants. For example, the channel portion 812 can be doped with N-type dopants if the semiconductor device is an N-type device, and the channel portion 812 can be doped with P-type dopants if the semiconductor device is a P-type device. That is, the fourth dopants of the channel portion 812 have different conductivity type from the first dopants of the core channel region 320. The doping concentration of the channel portion 812 can be from intrinsic to about $5 \times 10^{20}/cm^3$. The barrier portion 814 can be doped with same or different doping concentration and conductivity types than the channel portion 812. For instance a lower doping concentration of same conductivity type or even a doping concentration of opposite conductivity types of the barrier portion 814 to that of channel portion 812 can be used to reduce the band misalignment ΔE between the channel portion 812 and the barrier portion 814. The doping concentration of the barrier portion 814 can be from about intrinsic to about $5 \times 10^{20}/cm^3$.

The method 100 proceeds to blocks 112, 114, and 116 and FIG. 25. Specifically, in the operation 114, the gate stack 1000 includes the first gate 1010 and without the second gate 1020 (see FIG. 11). As such, the doped channel portion 812 and the doped barrier portion 814 provide electrostatic modulation at the barrier portion 814 to align the energy bands of the channel portion 812 and the barrier portion 814. Moreover, since the formation of the second source/drain region 910, the first gate 1010, and the spacers 1110 and 1120 are similar to that of the second source/drain region 910, the first gate 1010, and the spacers 1110 and 1120 mentioned above, and thus a description thereof is omitted.

In some embodiments, the barrier layer 510 in FIG. 25 is doped, and the doped barrier layer is similar to the barrier layer 510' of FIG. 11. In some embodiments, the gate stack 1000 in FIG. 25 includes the first gate 1010 and the second gate 1020, and the gate stack 1000 is similar to the gate stack 1000 of FIG. 11.

Figure 26:
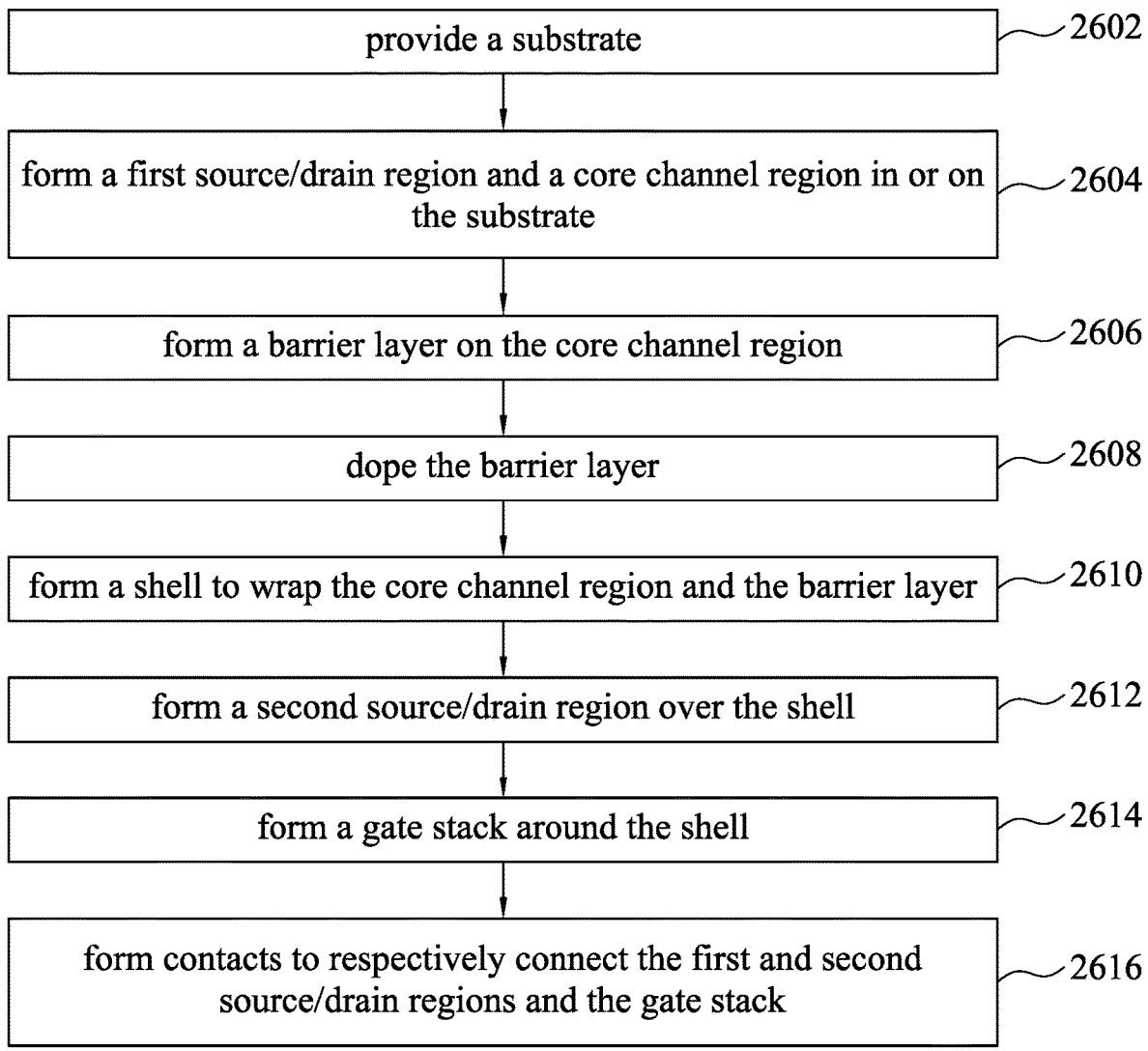
FIG. 26 is a flow chart of a method of manufacturing a semiconductor device in accordance with some embodiments of the present disclosure.
Figure 27:
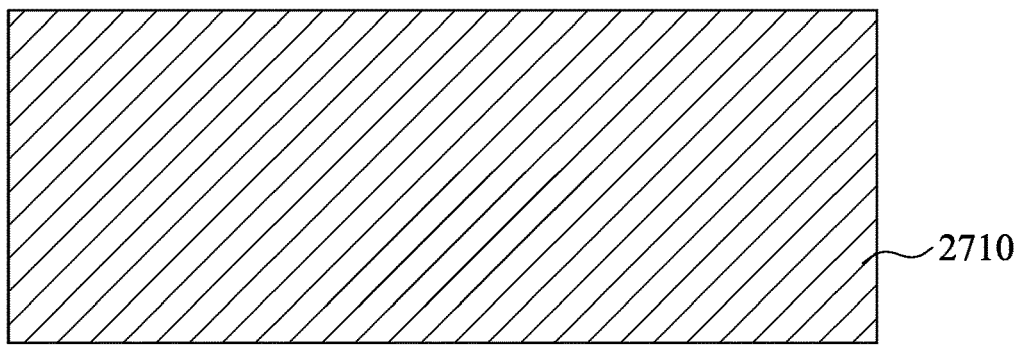
FIGS. 27-38 illustrate a semiconductor device at various stages according to aspects of the method of FIG. 26.

Illustrated in FIG. 26 is a flow chart of a method 2600 of manufacturing a semiconductor device in accordance with some embodiments of the present disclosure. FIGS. 27 to 38 illustrate a semiconductor device at various stages according to aspects of the method of FIG. 26. In some embodiments, the semiconductor device shown in FIGS. 26 to 38 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, bipolar transistors, high voltage transistors, high frequency transistors, other memory cells, and combinations thereof. In some embodiments, the semiconductor device shown in FIGS. 26 to 38 has a vertical transistor structure.

The method 2600 begins at block 2602 where a substrate is provided. Referring to the example of FIG. 27, in some embodiments of block 2602, a substrate 2710 is provided. The substrate 2710 may be a semiconductor substrate such as a silicon substrate. The substrate 2710 may include various layers, including conductive or insulating layers formed on the substrate 2710. The substrate 2710 may include various doping configurations depending on design requirements as is known in the art. The substrate 2710 may also include other semiconductors such as germanium, silicon carbide (SiC), silicon germanium (SiGe), or diamond. Alternatively, the substrate 2710 may include a compound semiconductor and/or an alloy semiconductor. Further, in some embodiments, the substrate 2710 may include an epitaxial layer (epi-layer), the substrate 2710 may be strained for performance enhancement, the substrate 2710 may include a silicon-on-insulator (SOI) structure, and/or the substrate 2710 may have other suitable enhancement features. The substrate 2710 may include a high-mobility material.

The method 2600 proceeds to block 2604 where a first source/drain region and a core channel region are formed in or on the substrate. Referring to the example of FIG. 28, in some embodiments of block 2604, a first source/drain region 2810 and a core channel region 2820 are formed in the substrate 2710. In some embodiments, the first source/drain region 2810 and the core channel region 2820 may include the same material as the substrate 2710, such as when the substrate 2710 includes a high-mobility material. For example, the substrate 2710 is etched to form a protrusion structure 2805, which protrudes out of the plane of substrate 2710. The protrusion structure 2805 is referred as a core structure 2805. The core structure 2805 may be formed by lithography and etching processes. In some embodiments, a hard mask layer is deposited on the substrate 2710 first. The hard mask includes silicon oxide, silicon nitride, silicon oxynitride, or any other suitable dielectric material. The hard mask may be patterned by lithography and etching processes to define the core structure 2805. The substrate 2710 is etched by using the patterned hard mask as an etching mask to form the core structure 2805. The etch process may include wet etch, dry etch, or a combination thereof. In some embodiments, the core structure 2805 is formed as a cylinder shape, and a diameter of the core structure 2805 may be about 4 nm to about 30 nm. Alternatively, the core structure 2805 is formed as square-column, oval cylinder, rectangular column, hexagonal column, or other polygon-column shape.

In some embodiments, isolation features 2830 are formed in the substrate 2710, including between each core structure 2805. The isolation features 2830 include different structures formed by using different processing technologies. In some embodiments, the isolation features 2830 are shallow trench isolation (STI) features. The formation of a STI may include etching a trench in the substrate 2710 and filling in the trench with insulator materials such as silicon oxide, silicon nitride, or silicon oxynitride. The filled trench may have a multi-layer structure such as a thermal oxide liner layer with silicon nitride filling the trench.

Subsequently, the first source/drain region 2810 is formed on the substrate 2710. The first source/drain region 2810 is formed by doping a predetermined top portion of the substrate 2710 by a suitable technique, such as implantation with a patterned photo resist as an implantation mask. For a p-type TFET, the first source/drain region 2810 may be doped with n-type dopants, such as phosphorus, arsenic, or combinations thereof. For an n-type TFET, the first source/drain region 2810 may be doped with p-type dopants, such as boron or $BF_2$. After the implantation, one or more annealing processes may be performed for dopant activation. The annealing processes may include rapid thermal anneal (RTA), laser anneal, or other suitable annealing process. As an example, high-temperature anneal includes a "spike" annealing process that has a very short time duration. During the formation, the dopant is diffused up to a bottom portion of the core structure 2805.

Figure 28:
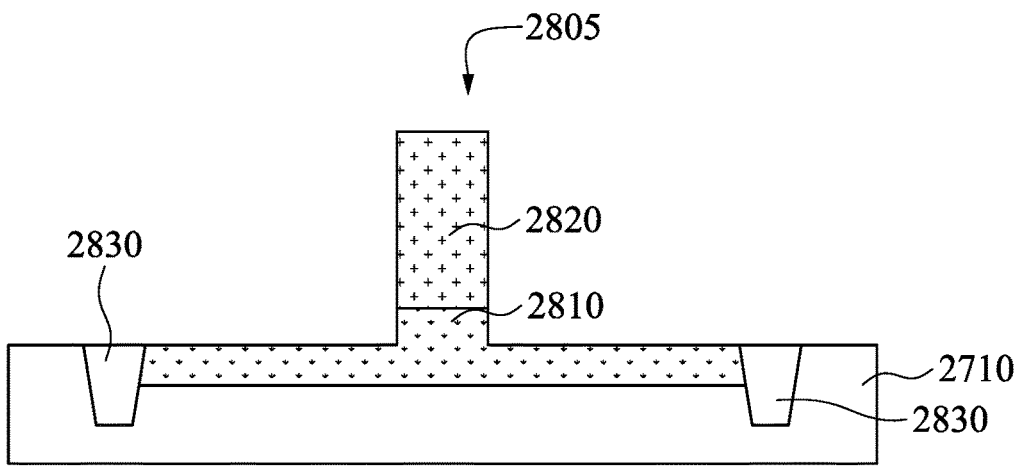

It is noted that although in FIG. 28, the first source/drain region 2810 and the core channel region 2820 are formed by patterning and doping the substrate 2710, in some other embodiments, however, the first source/drain region 2810 and/or the core channel region 2820 can be epitaxially layers. For example, a source material layer and a channel material layer are sequentially formed on the substrate 2710, and a lithography and etching process is performed on the source material layer and the channel material layer to form the first source/drain region 2810 and the core channel region 2820. Or, in still some other embodiments, the substrate 2710 is doped to form the first source/drain region 2810, and a channel material layer is epitaxially formed on the first source/drain region 2810. The channel material layer is then patterned to form the core channel region 2820.

In some embodiments, the core channel region 2820 can be doped, and the conductivity type is the same as that of the first source/drain region 2810. That is, the first source/drain region 2810 and the core channel region 2820 have the same conductivity type. Further, the doping concentration of the core channel region 2820 is higher than about $5 \times 10^{18}/cm^3$ and may be higher than that of the first source/drain region 2810. When the core channel region 2820 is epitaxially formed, the core channel region 2820 may be in-situ doped during the epitaxy process. In some embodiments, the core channel region 2820 is not in-situ doped, an implantation process (i.e., a junction implant process) is performed to dope the core channel region 2820.

The method 2600 proceeds to block 2606 where a barrier layer is formed on the core channel region. Referring to the example of FIG. 29, in some embodiments of block 2606, a barrier layer 2910 is formed on the core channel region 2820. That is, the barrier layer 2910 is in contact with the core channel region 2820. In various embodiments, the barrier layer 2910 is regrown using an epitaxial growth process such as molecular beam epitaxy (MBE), metalorganic chemical vapor deposition (MOCVD), and/or other suitable regrowth process. By way of example, the regrown barrier layer 2910 may include any of a plurality of semiconductor materials such as SiGe, strained Ge, Ge, GaAs, GaP, InP, InAs, InSb, GaAsP, InAlAs, AlGaAs, InGaAs, GaInP, and/or GaInAsP, or combinations thereof. In some other embodiments, the barrier layer 2910 is an oxide layer. The barrier layer 2910 is similar in many respects to those discussed above in association with the barrier layer 510 in FIG. 5. In some other embodiments, a plurality of epitaxial layers may be formed on the substrate 2710 and then etched to be the first source/drain region 2810, the core channel region 2820, and the barrier layer 2910.

Figure 29:
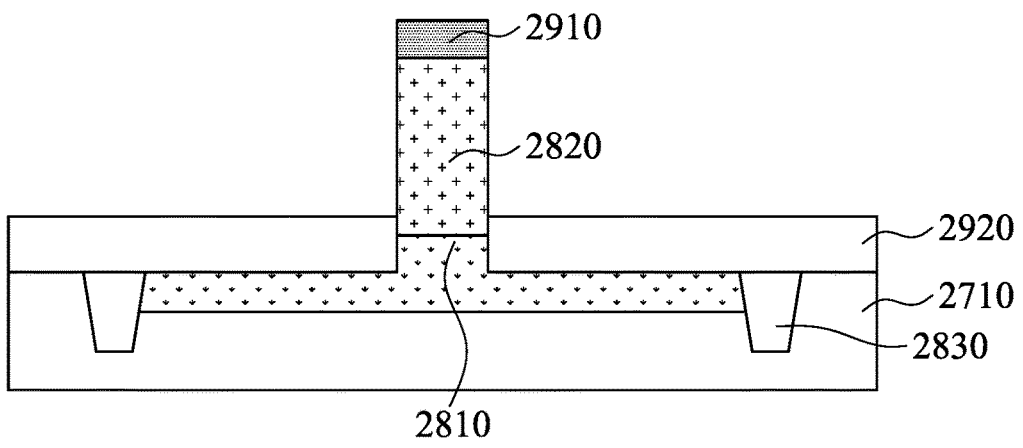
Figure 30:
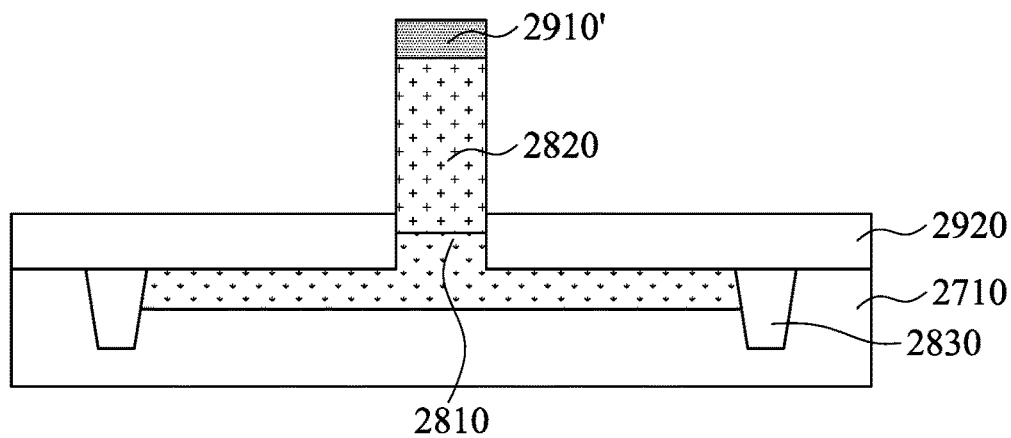
Figure 31:
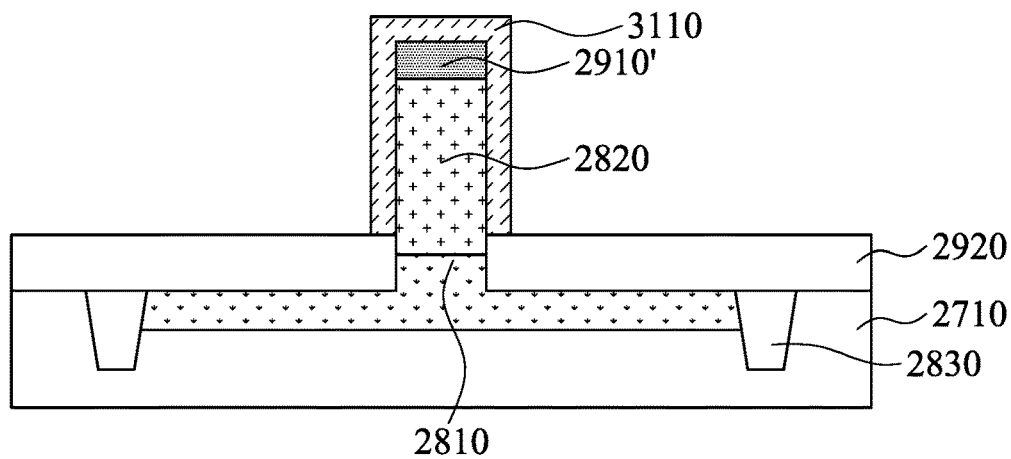
Figure 32:
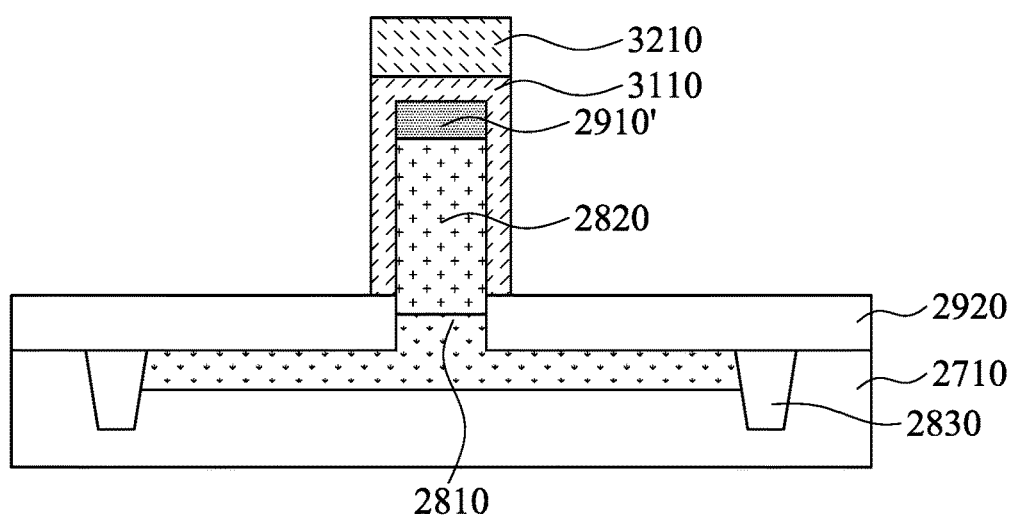
Figure 33:
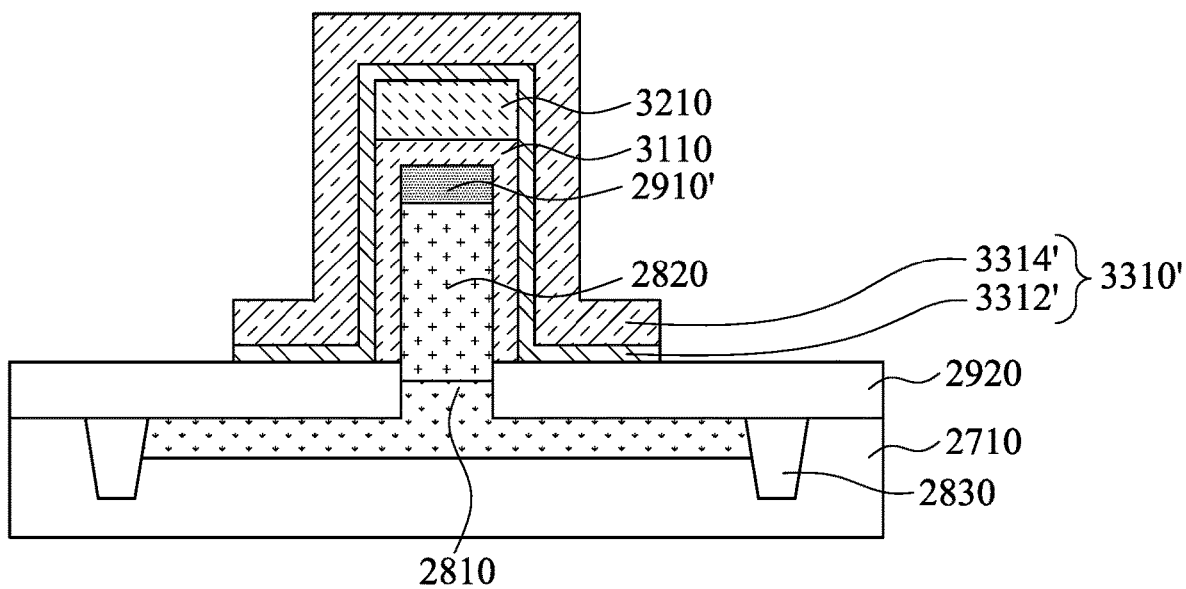

Then, a first spacer is formed on the substrate. Referring to the example of FIG. 29, a first spacer 2920 is formed on the substrate 2710. The first spacer 2920 is formed over the first source/drain region 2810 by deposition and recess processes. The first spacer 2920 includes low-k materials such as silicon oxide, silicon nitride, silicon carbide, oxynitride or other suitable materials. The first spacer 2920 includes a single layer or multiple layers. The first spacer 2920 is deposited by a suitable technique, such as chemical vapor deposition (CVD), atomic layer deposition (ALD), physical vapor deposition (PVD), thermal oxidation, or combinations thereof. In FIG. 29, the first spacer 2920 is etched back to wrap the first source/drain region 2810 and a portion of the core channel region 2820. The first spacer 2920 may be recessed by a selective dry etch, a selective wet etch, or combinations thereof.

The method 2600 proceeds to block 2608 where the barrier layer is doped. Referring to the example of FIG. 30, the barrier layer 2910' is similar in many respects to those discussed above in association with the barrier layer 510' in FIGS. 6 and 11.

The method 2600 proceeds to block 2610 where a shell is formed to wrap the barrier layer and the core channel region. Referring to the example of FIG. 31, in some embodiments of block 2610, a shell 3110 is formed to wrap the barrier layer 2910' and the core channel region 2820. That is, the shell 3110 is in contact with the barrier layer 2910' and the core channel region 2820. The shell 3110 is similar in many respects to those discussed above in association with the shell 810 in FIG. 8.

The method 2600 proceeds to block 2612 where a second source/drain region is formed over the shell. Referring to the example of FIG. 32, in some embodiments of block 2612, a second source/drain region 3210 is formed over the shell 3110. In some embodiments, the second source/drain region 3210 is formed by photolithography patterning and implantation. The second source/drain region 3210 has a different conductivity type than the first source/drain region 2810. In some other embodiments, a semiconductor material is epitaxially grown on the shell 3110. The semiconductor material includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). For example, the semiconductor material may include InAs or InGaAs for N-type devices and GaSb or GaAsSb for P-type devices. The epitaxial processes include CVD deposition techniques (e.g., vapor-phase epitaxy (VPE) and/or ultra-high vacuum CVD (UHV-CVD)), molecular beam epitaxy, and/or other suitable processes. The second source/drain region 3210 may be formed by one or more epitaxy or epitaxial (epi) processes. The second source/drain region 3210 may be in-situ doped during the epitaxy process. In some embodiments, the second source/drain region 3210 is not in-situ doped, an implantation process (i.e., a junction implant process) is performed to dope the second source/drain region 3210.

The method 2600 proceeds to block 2614 where a gate stack is formed around the shell. Referring to the example of FIG. 33, in some embodiments of block 2614, a first gate 3310' is formed around the shell 3110. The first gate 3310' includes a planar portion, which is parallel to the surface of substrate 2710 and over the first spacer 2920, and a gating surface, which wraps around the core channel region 2820. The first gate 3310' includes a gate dielectric layer 3312' and a variety of metal layers 3314'.

In some embodiments, the first gate 3310' is formed using a gate-first process. Alternatively, in some examples, the first gate 3310' is formed using a gate-last process. In some examples, a gate-first process includes formation of a gate stack prior to source/drain formation or source/drain dopant activation. Merely by way of example, a gate-first process may include gate dielectric and metal gate depositions, followed by a gate stack etch process to define a gate critical dimension (CD). In some embodiments of a gate-first process, gate stack formation may be followed by source/drain formation including doping of source/drain regions and, in some examples, annealing for source/drain dopant activation. In some examples, a gate-late process includes forming a dummy gate stack that will be replaced by a final gate stack at a subsequent processing stage of the semiconductor device. For example, a dummy gate stack may be replaced at a later processing stage by a high-K dielectric layer (HK) and metal gate electrode (MG). In some other embodiments, the first gate 3310' is a polysilicon gate stack. The polysilicon gate stack may include a gate dielectric layer and a polysilicon layer deposited over the gate dielectric layer. The gate dielectric layer includes silicon oxide, silicon nitride, or any other suitable materials.

The first gate 3310' is formed by any suitable process or processes. For example, the first gate 3310' is formed by a procedure including depositing, photolithography patterning, and etching processes. The deposition processes include CVD, PVD, ALD, metalorganic CVD (MOCVD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching process includes a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. The etching process may include a multiple-step etching to gain etch selectivity, flexibility and desired etch profile.

In some embodiments, the first gate 3310' includes an interfacial layer between the core channel region 2820 and the gate dielectric layer 3312'. By way of example, the interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer 3312' may include a high-K dielectric layer such as hafnium oxide ($HfO_2$). Alternatively, the gate dielectric layers 1012 and 1022 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layer 3312' may be formed by ALD, physical vapor deposition (PVD), CVD, oxidation, and/or other suitable methods. The metal layers 3314' may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layers 3314' may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. The metal layers 3314' may be formed by ALD, PVD, CVD, e-beam evaporation, or other suitable process. Further, the metal layers 3314' may be formed separately for N-FET and P-FET transistors which may use different metal layers. In various embodiments, a CMP process may be performed to remove excessive metal from the metal layers 3314', and thereby provide a substantially planar top surface of the metal layers 3314'. In some examples, the first gate 3310' may be formed on a single side of the core channel region 2820. In some examples, the first gate 3310' may be positioned on more than one side of the core channel region 2820.

Figure 34:
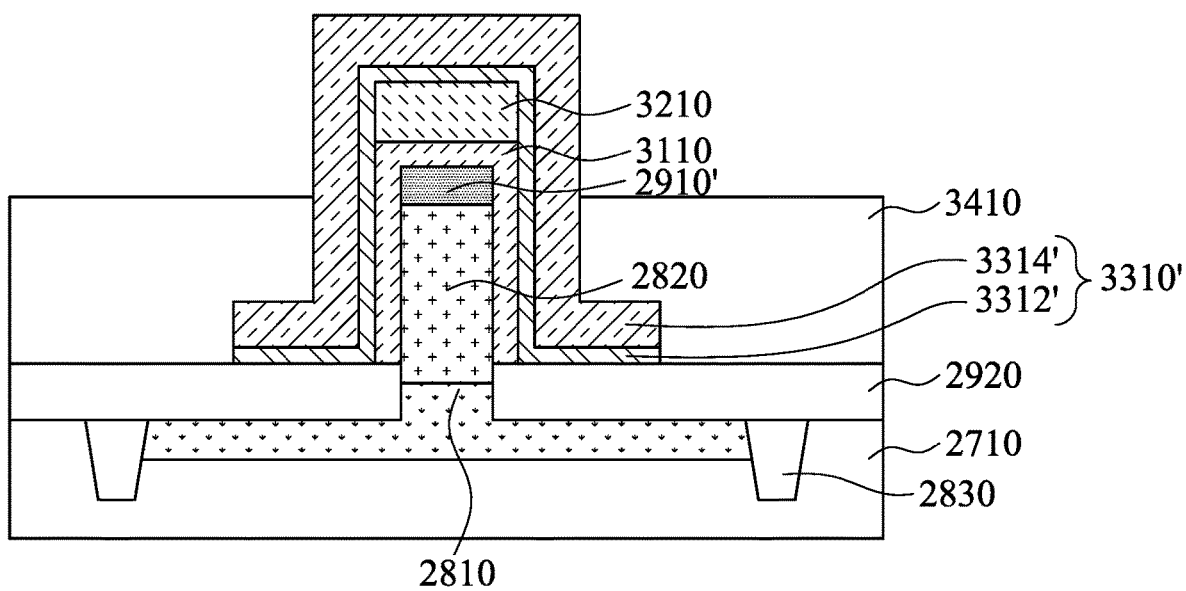

Referring to the example of FIG. 34, a first interlayer dielectric (ILD) 3410 is formed over the first spacer 2920 and around the first gate 3310'. The first ILD 3410 is similar in many respects to those discussed above in association with the first spacer 2920 in FIG. 29. The first ILD 3410 is etched back to expose a predetermined height of a top portion of the gating surface of first gate 3310'.

Figure 35:
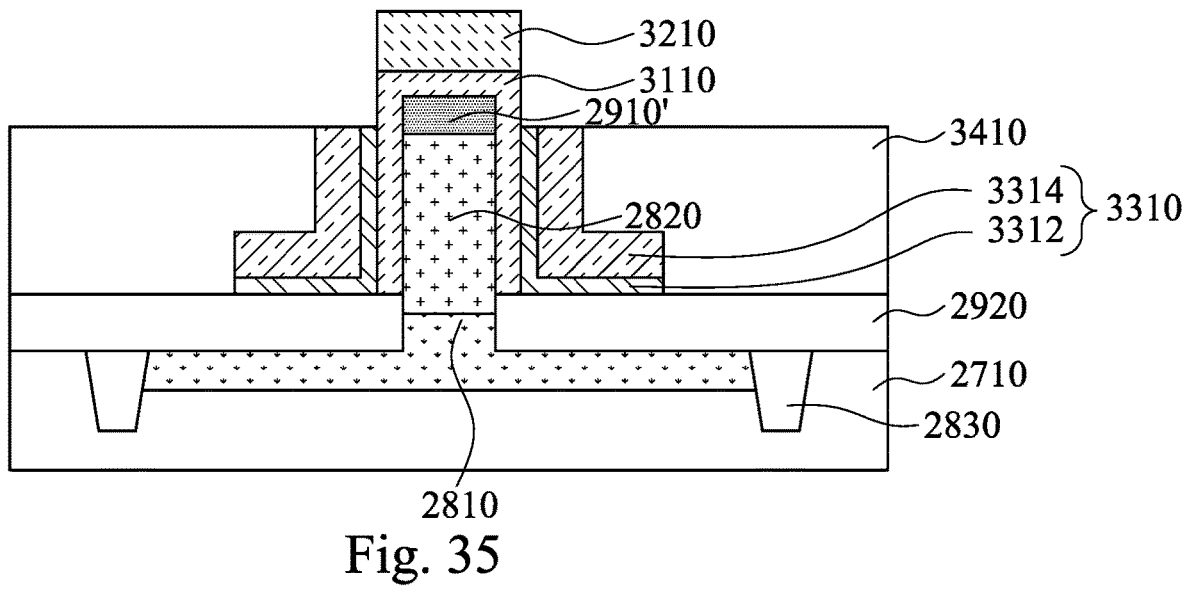

Referring to the example of FIG. 35, the first gate 3310' of FIG. 34 is etched back to form the first gate 3310, which exposes the second source/drain region 3210. The first gate 3310 includes the gate dielectric layer 3312 and the first metal layers 3314. The top portion of the gating surface of the first gate 3310' may be removed by a selective dry etch, a selective wet etch, a combination thereof, or other suitable processes. In some embodiments, the gating surface of the first gate 3310' above the first ILD 3410 is removed.

Figure 36:
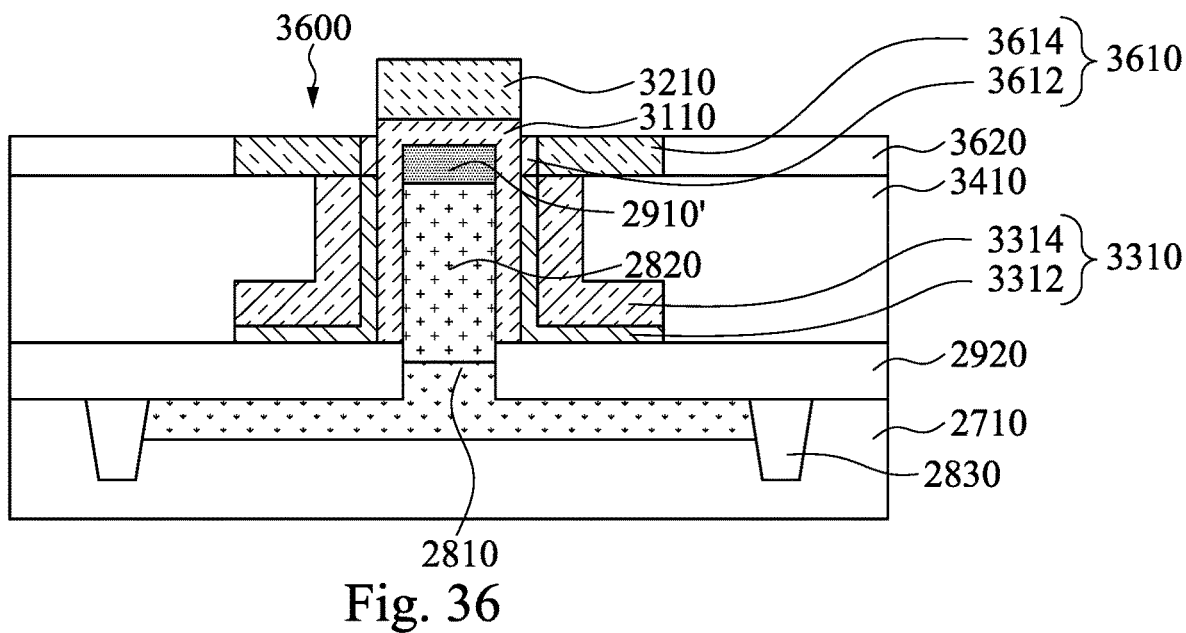

Referring to the example of FIG. 36, a second gate 3610 is formed over the first gate 3310, and the second gate 3610 is etched back. The formation of the second gate 3610 and the third ILD layer 3620 are similar to that of the first gate 3310 and the first ILD layer 3410, and thus a description thereof is omitted. Also, the second gate 3610 is similar in many respects to those discussed above in association with the second gate 1020 in FIG. 10. For example, the second gate 3610 includes a gate dielectric layer 3612 and a variety of second metal layers 3614. Furthermore, the lengths among the core channel region 2820, the barrier layer 2710', the shell 3110, the first gate 3310, and the second gate 3610 are the same as or similar to the lengths and length ratios among the core channel region 320, the barrier layer 510', the shell 810, the first gate 1010, and the second gate 1020 discussed above, and a detailed description is omitted here. The first gate 3310 and the second gate 3610 form the gate stack 3600.

Figure 37:
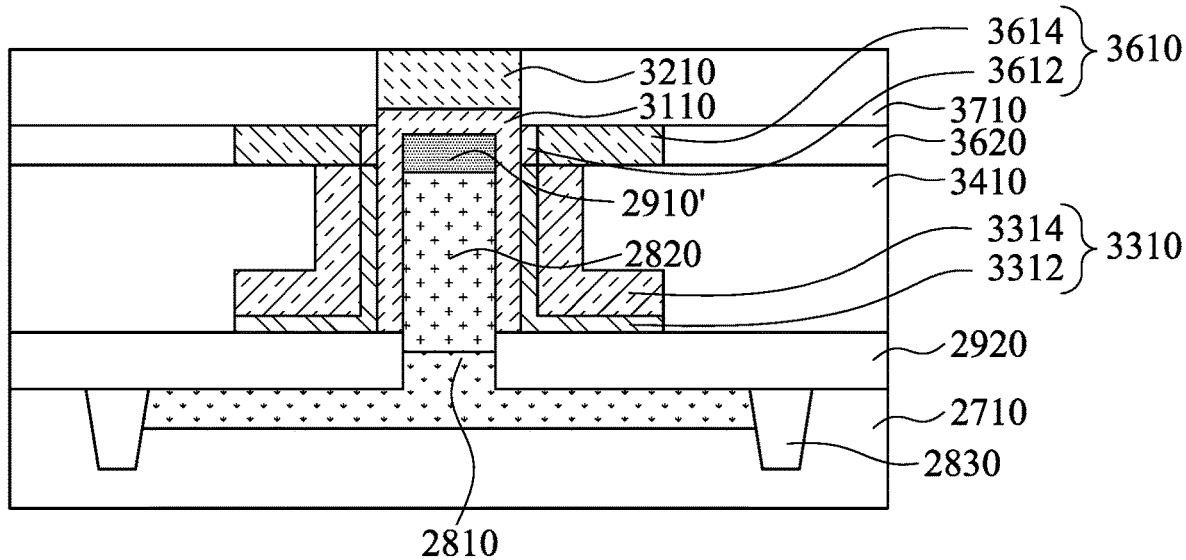

Referring to the example of FIG. 37, a second spacer 3710 is formed on the second ILD 3620 and wrapping around the second source/drain region 3210. The second spacer 3710 is deposited over the second ILD 3620. The second spacer 3710 is similar in many respects to those discussed above in association with the first spacer 2920 in FIG. 29. Additionally, a CMP process is performed to planarize the top surface of the second spacer 3710.

The method 2600 proceeds to block 2616 where contacts are formed to respectively contact the first source/drain region, the gate stack, and the second source/drain region. Referring to the example of FIG. 38, a second ILD 3810 is formed on the second spacer 3710 and the second source/drain region 3210. The second ILD 3810 is similar in many respects to those discussed above in association with the first spacer 2920 in FIG. 29.

Then, contacts 3820, 3830, and 3840 are formed in the second ILD 3810 to be respectively in contact with the first source/drain region 2810, the gate stack 3600, and the second source/drain region 3210. In some embodiments, the second ILD 3810 is etched to form a plurality of openings by various methods, including a dry etch, a wet etch, or a combination of dry etch and wet etch. The openings extend through at least the second ILD 3810. Filling materials are formed in the openings. In some embodiments, metal materials can be filled in the openings, and excessive portions of the metal materials are removed by performing a CMP process to form the contacts 3820, 3830, and 3840. The filling materials can be made of tungsten, aluminum, copper, or other suitable materials.

The semiconductor device may undergo further processing to form various features and regions known in the art. For example, subsequent processing may form various vias/lines and multilayers interconnect features (e.g., metal layers and interlayer dielectrics) on the substrate 2710, configured to connect the various features to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 39:
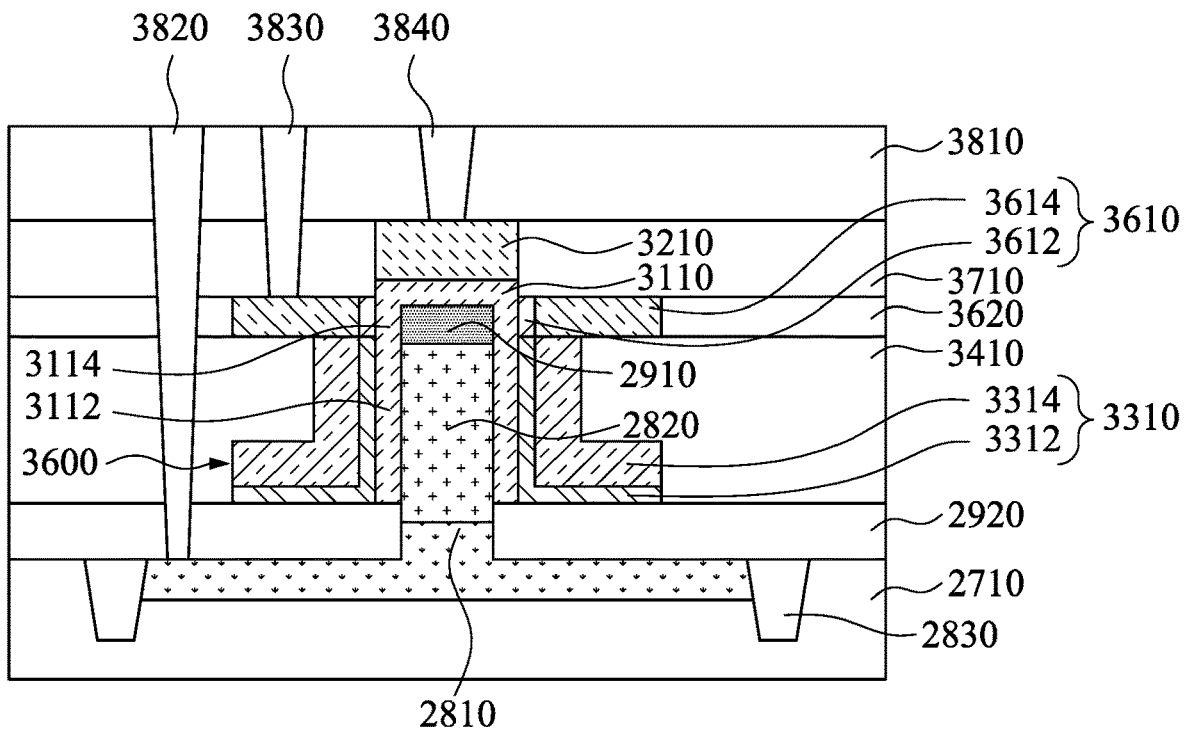
FIGS. 39-40 illustrate semiconductor devices in accordance with some embodiments of the present disclosure.

Moreover, additional process operations may be implemented before, during, and after the method 2600, and some process operations described above may be replaced or eliminated in accordance with various embodiments of the method 100. In some embodiments, for example, at least parts of the method 2600 may be implemented to fabricate a device which includes the barrier layer 2910. With reference to FIG. 39, illustrated therein is a schematic view of a semiconductor device which includes the barrier layer 2910 at the drain side of the device. The operation 2608 (see FIG. 26) of method 2600 is omitted in FIG. 39. That is, the barrier layer 2910 is not doped. The second gate 3610 is formed to surround the barrier layer 2910. In some examples, the barrier layer 2910 may extend slightly beyond the second gate 3610. In some examples, the second gate 3610 may extend slightly beyond the barrier layer 2910.

The work functions of the first gate 3310 and the second gate 3610 are different. In an exemplary embodiment, for an N-type device, the work function of the first gate 3310 is smaller than the work function of the second gate 3610 by about 0.3 eV to about 0.6 eV or by more than 0.6 eV, e.g., 0.9 eV; for a P-type device, the work function of the first gate 3310 is greater than the work function of the second gate 3610 by about 0.2 eV to about 0.6 eV or by more than 0.6 eV, e.g., 0.9 eV. If the difference of the work functions is too small, e.g. smaller than about 0.2 eV, the band may not be aligned, and if the difference is too large, e.g. larger than about 0.6 eV, the off state current of the device may be degraded. In some embodiments, the EOT of the second gate 3610 is small, and may have a range of about 0.25 nm to about 10 nm. Further, the EOT of the second gate 3610 is smaller than that of the first gate 3310.

Figure 40:
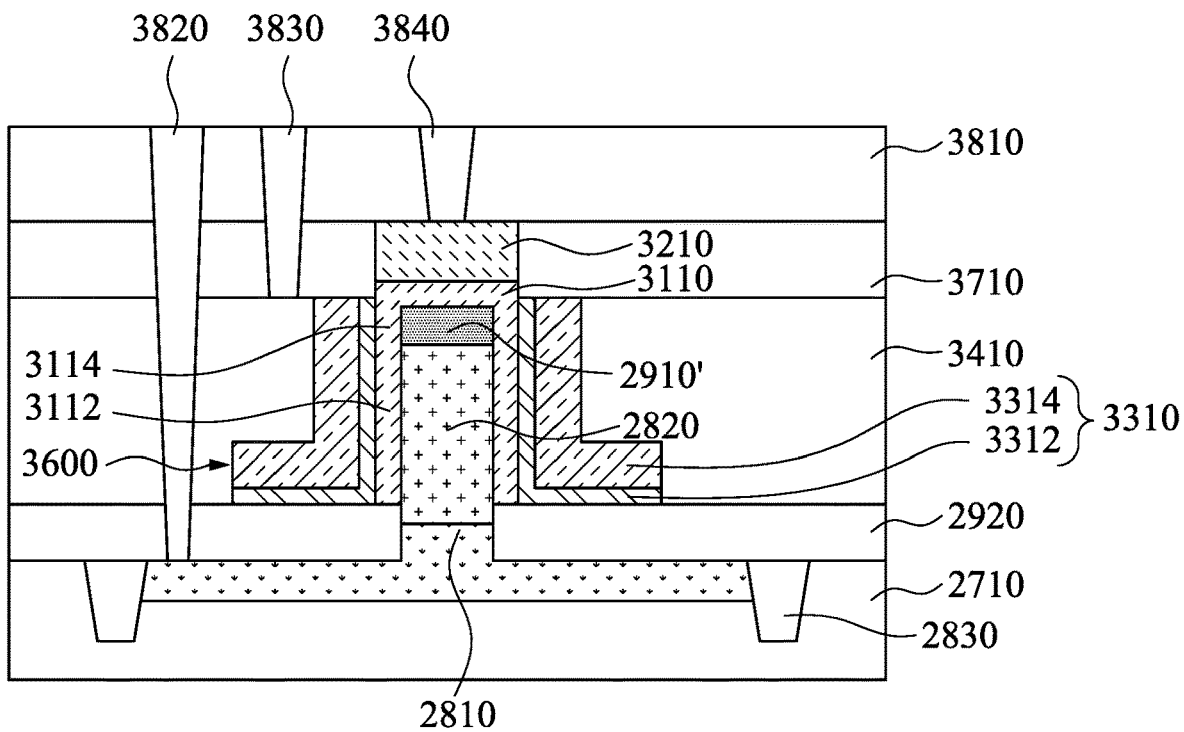

In some other embodiments, for example, at least parts of the method 2600 may be implemented to fabricate a device which includes the barrier layer 2910'. With reference to FIG. 40, illustrated therein is a schematic view of a semiconductor device which includes the barrier layer 2910' at the drain side of the semiconductor device. The operation 2614 of method 2600 is different in FIG. 40. In FIG. 40, the first gate 3310 is formed to wrap the core channel region 2820 and the barrier layer 2910'. The first gate 3310 is positioned such that it wraps the barrier layer 2910'. In some examples, the barrier layer 2910' may extend slightly beyond the first gate 3310. In some examples, the first gate 3310 may extend slightly beyond the barrier layer 2910'. In some embodiments, the barrier layer 2910' may have a doping concentration greater than about $5 \times 10^{18}/cm^3$ (about $5 \times 10^{19}/cm^3$ for example), and the core channel region 2820 may have a doping concentration that is about $1 \times 10^{20}/cm^3$. The first dopants of the core channel region 2820 and the third dopants of the barrier layer 2910' have the same conductivity type. In some embodiments, the doping concentration of the barrier layer 2910' is higher than that of the first source/drain region 2810 and lower than that of the core channel region 2820.

Figure 38:
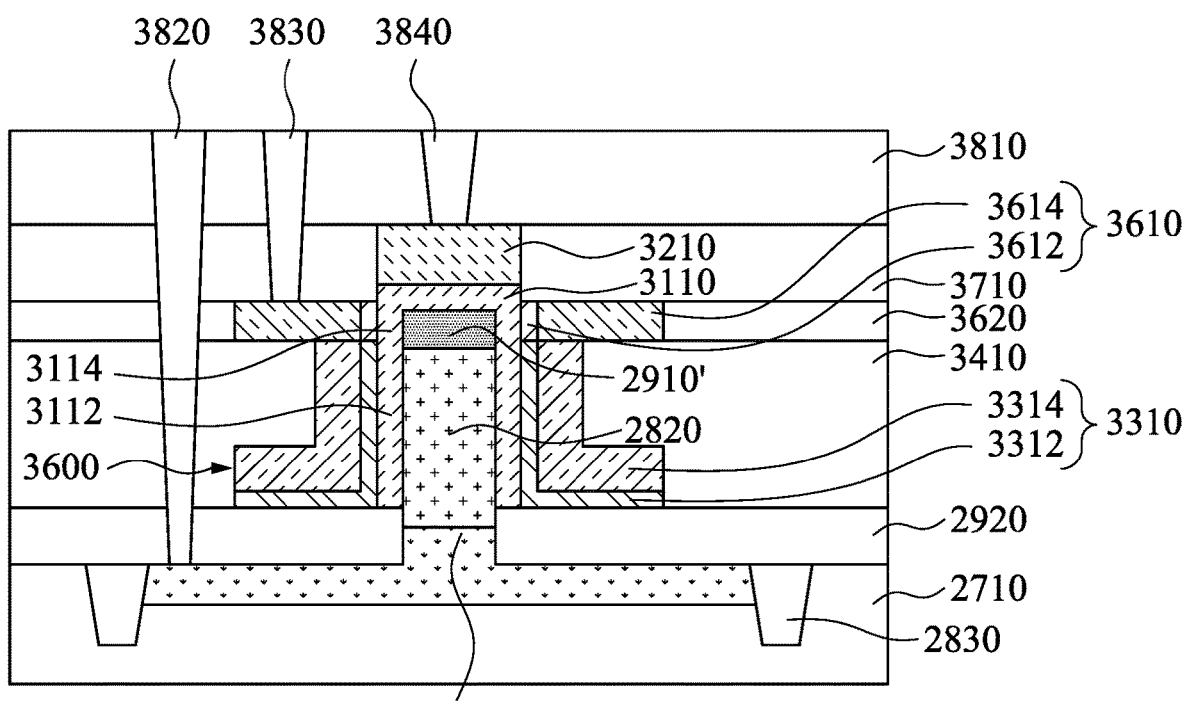

With such configuration, the semiconductor devices in FIGS. 38-40 enable high performance CMOS speed at $V_{DD}$ about 0.3V. The shell 3110 includes a channel portion 3112 and a barrier portion 3114. In various embodiments, the doped barrier layer 2910' and/or the second gate 3610 provides electrostatic modulation at the barrier portion 3114. Thus, by such electrostatic gate modulation, the energy band of the barrier portion 3114 may be tuned, such that the conduction energy difference between the channel portion 3112 and the barrier portion 3114 can be reduced. In other words, the energy band of the barrier portion 3114 can be substantially aligned with the energy band of the channel portion 3112. In some embodiments, the band energy difference $\Delta E$ is less than about 0.2 eV.

Figure 41:
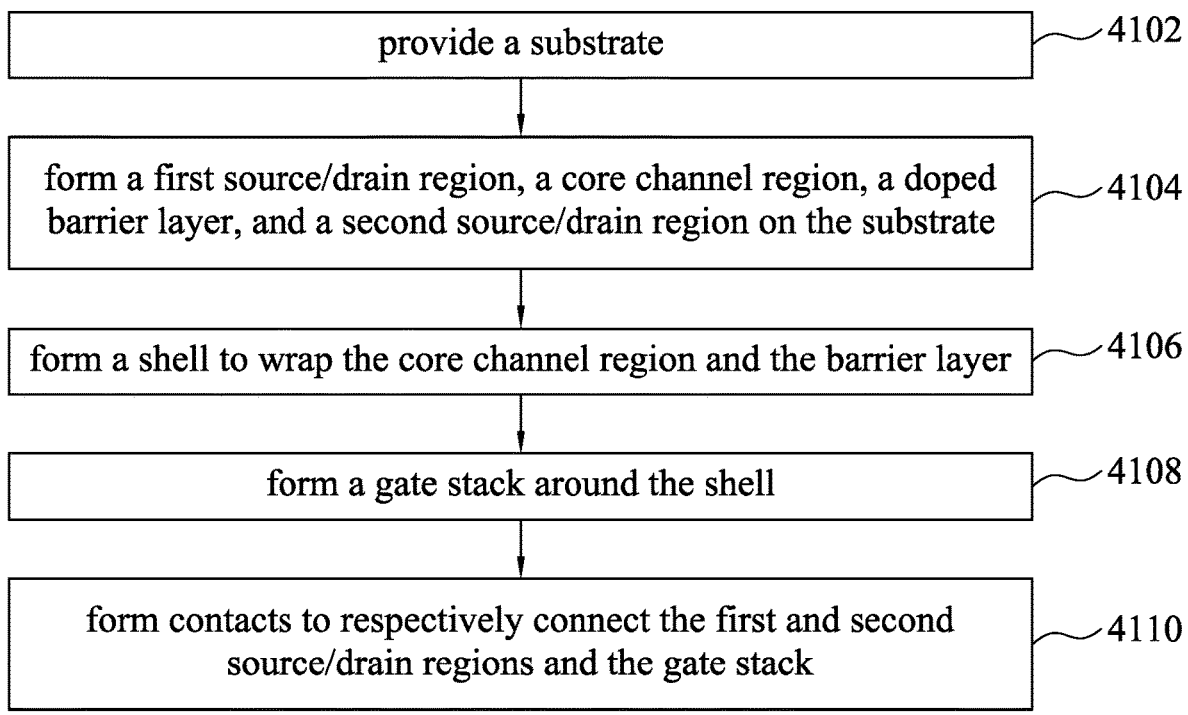
FIG. 41 is a flow chart of a method of manufacturing a semiconductor device in accordance with some embodiments of the present disclosure.
Figure 42:
FIGS. 42-46 illustrate a semiconductor device at various stages according to aspects of the method of FIG. 41.
Figure 43:
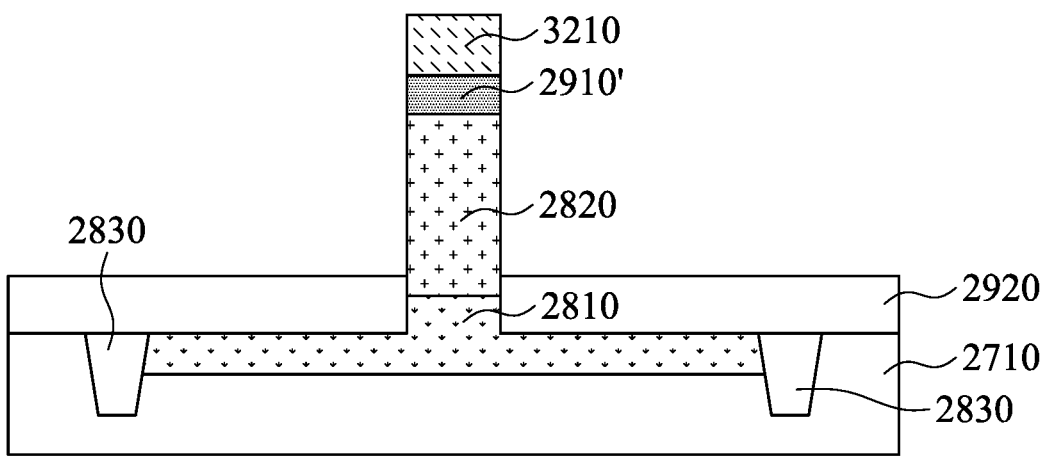
Figure 44:
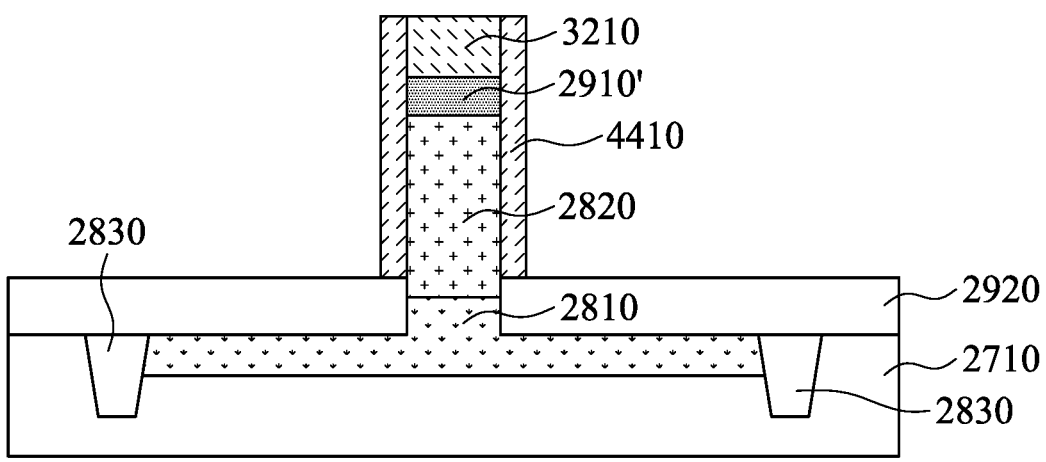

Illustrated in FIG. 41 is a flow chart of a method 4100 of manufacturing a semiconductor device in accordance with some embodiments of the present disclosure. FIGS. 42 to 46 illustrate a semiconductor device at various stages according to aspects of the method of FIG. 41. The method 4100 begins at block 4102 where a substrate is provided. Referring to the example of FIG. 42, in some embodiments of block 4102, a substrate 2710 is provided. The substrate 2710 may be a semiconductor substrate such as a silicon substrate. The substrate 2710 is similar in many respects to those discussed above in association with the substrate 2710 in FIG. 27.

The method 4100 proceeds to block 4104 where a first source/drain region, a core channel region, a doped barrier layer, and a second source/drain region are formed on the substrate. Referring to the example of FIG. 43, in some embodiments of block 4104, a first source/drain region 2810, a core channel region 2820, a barrier layer 2910', and a second source/drain region 3210 are sequentially formed on the substrate 2710. In some embodiments, a plurality of epitaxial layers are formed on the substrate 2710 in advance, and an etching process is performed on these epitaxial layers to form the first source/drain region 2810, the core channel region 2820, the barrier layer 2910', and the second source/drain region 3210. The first source/drain region 2810, the core channel region 2820, the barrier layer 2910', and the second source/drain region 3210 are similar in many respects to those discussed above in association with the first source/drain region 2810, the core channel region 2820, the barrier layer 2910', and the second source/drain region 3210 in FIG. 38.

In some embodiments, isolation features 2830 are formed in the substrate 2710 and between each core channel regions 2820. The isolation features 2830 are similar in many respects to those discussed above in association with the isolation features 2830 in FIG. 28.

Then, a first spacer 2920 is formed on the substrate 2710. The first spacer 2920 is formed to wrap the first source/drain region 2810 by deposition and etching processes. The first spacer 2920 is similar in many respects to those discussed above in association with the first spacer 2920 in FIG. 29.

The method 4100 proceeds to block 4106 where a shell is formed to wrap the core channel region and the barrier layer. Referring to the example of FIG. 44, in some embodiments of block 4106, a semiconductor material 4410 is formed to wrap the first source/drain region 2810, the core channel region 2820, the barrier layer 2910', and the second source/drain region 3210. For example, a semiconductor layer is formed to cover the structure of FIG. 43, and then an etching process is performed to form the semiconductor material 4410. The semiconductor material 4410 is similar in many respects to those discussed above in association with the semiconductor material 1910 in FIG. 19.

Figure 45:
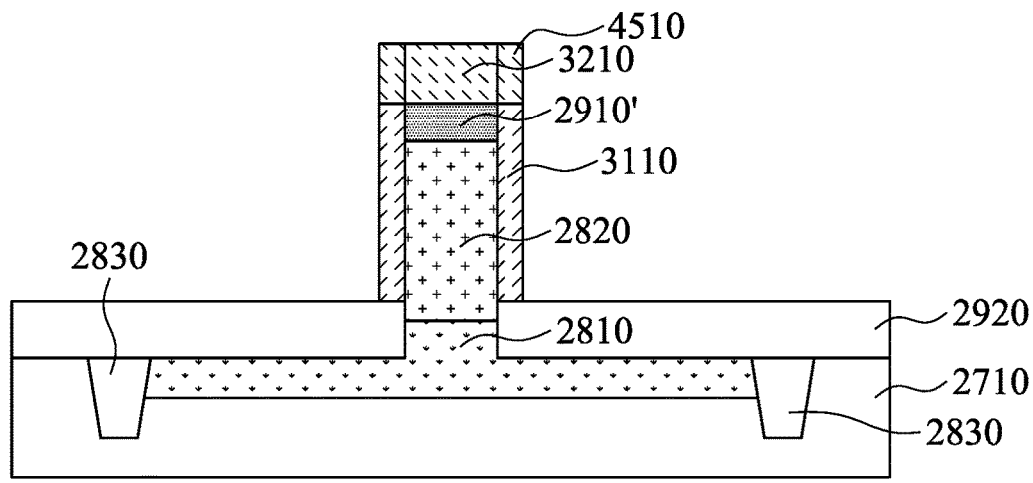

Reference is made to FIG. 45. A portion of the semiconductor material 4410 wrapping the second source/drain region 3210 is doped to form a doped region 4510 which has the same conductivity type and similar doping concentration as the second source/drain region 3210. The doped region 4510 and the second source/drain region 3210 form a drain of the semiconductor device. The remained semiconductor material forms a shell 3110. The shell 3110 is similar in many respects to those discussed above in association with the shell 3110 in FIG. 38.

Figure 46:
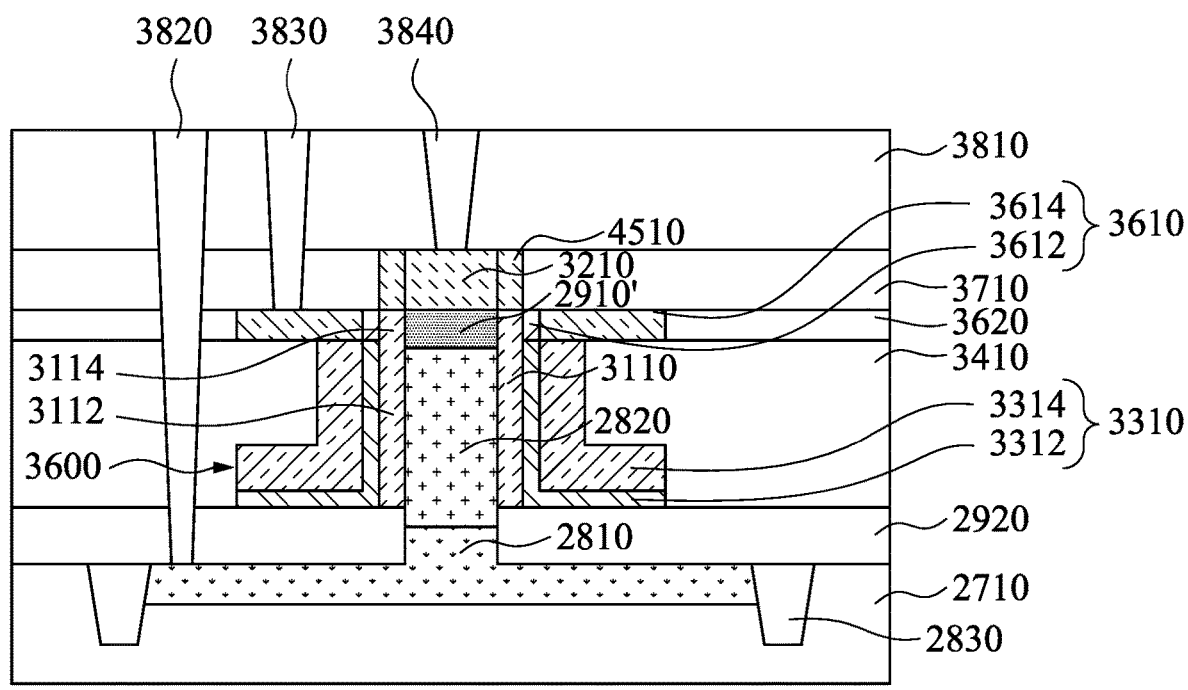

The method 4100 further proceeds to blocks 4108 and 4110 and FIG. 46. Since the formation of the gate stack 3600 and the contacts 3820, 3830, and 3840 are similar to that of the gate stack 3600 and the contacts 3820, 3830, and 3840 mentioned above, and thus a description thereof is omitted. In FIG. 46, the shell 3110 includes a channel portion 3112 and a barrier portion 3114. The doping of the barrier layer 2910' and/or the first and second gate configuration provide electrostatic modulation at the barrier portion 3114 to align the energy bands of the channel portion 3112 and the barrier portion 3114.

In some embodiments, the barrier layer 2910 is not doped, and the gate stack 3600 including first and second gates 3310 and 3610 provides electrostatic modulation. In some other embodiments, the gate stack 3600 is without the second gate 3610, and the barrier layer 2910' which has the same conductivity type of dopants as the core channel region 320 provides electrostatic modulation. In still some other embodiments, the barrier layer 2910' and the core channel region 2820 have opposite conductivity types of dopants to suppress current leakage, and the gate stack 3600 including first and second gates 3310 and 3610 provides electrostatic modulation.

Figure 47:
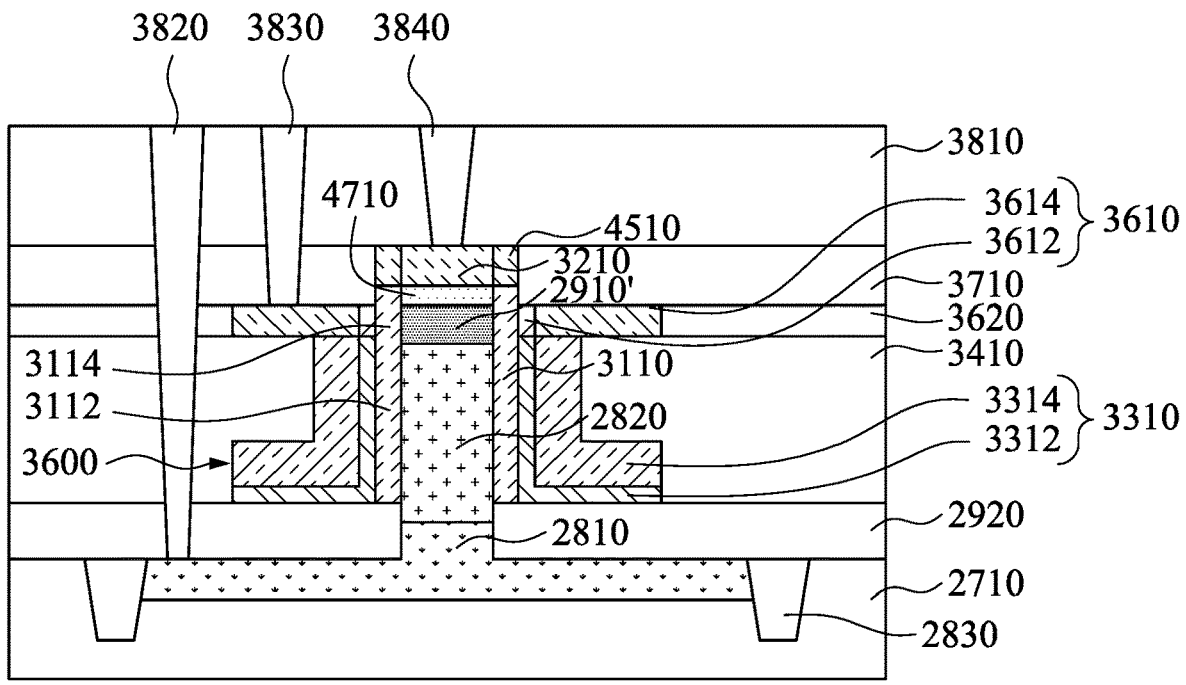
FIGS. 47-48 illustrate semiconductor devices in accordance with some embodiments of the present disclosure.

With reference to FIG. 47, illustrated therein is a schematic view of a semiconductor device which includes a semiconductor material 4710 between the barrier layer 2910' (or 2910) and the second source/drain region 3210. In FIG. 47, the semiconductor material 4710 may have the same material as the second source/drain region 3210 but with a lower doping concentration than the second source/drain region 3210. In some embodiments, the semiconductor material 4710 is intrinsic. In some other embodiments, the semiconductor material 4710 is doped with the same conductivity type dopants as the second source/drain region 3210. The dopant distribution in the semiconductor material 4710 may be uniform or nonuniform. For example, the dopant concentration of the semiconductor material 4710 increases in the direction from the barrier layer 2910' towards the second source/drain region 3210. The semiconductor material 4710 reduces ambipolar leakage current in the off-state of the device.

Figure 48:
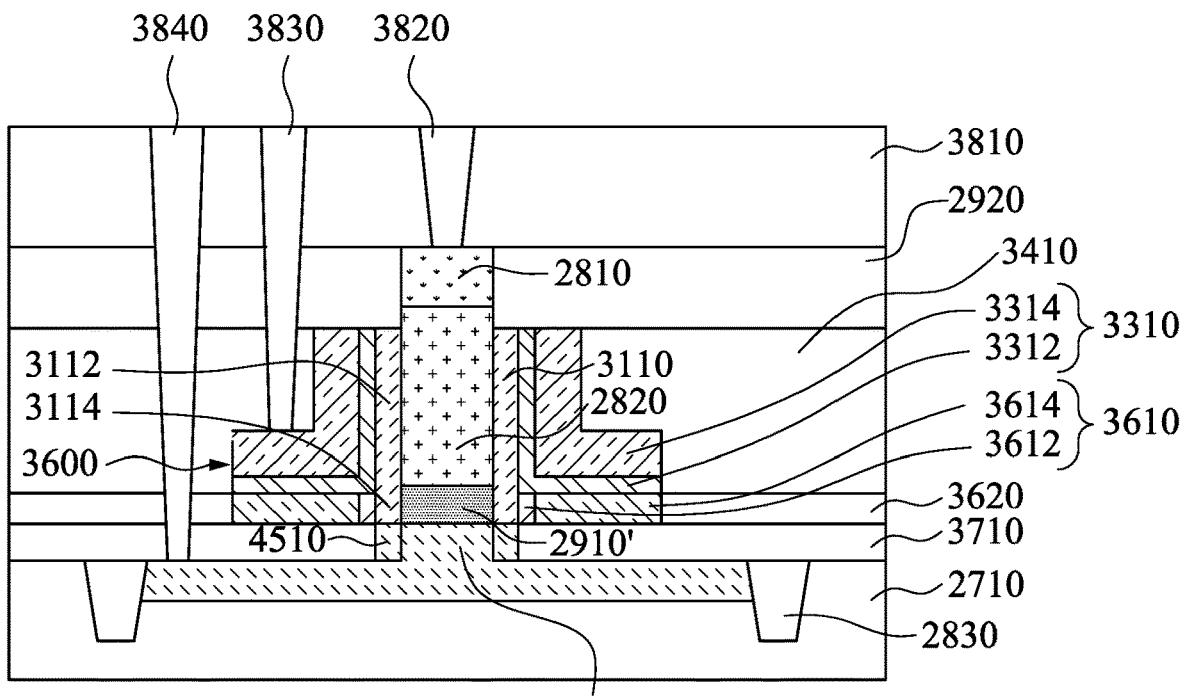

With reference to FIG. 48, illustrated therein is a schematic view of a semiconductor device according to some embodiments. In FIG. 48, the second source/drain region 3210, the barrier layer 2910' (or 2910), the core channel region 2820, and the first source/drain region 2810 are sequentially formed on the substrate 2710. Then, the shell 3110 and the doped layer 4510 are formed on the substrate 2710. Furthermore, the first gate 3310 of the gate stack 3600 is formed on the second gate 3610 of the gate stack 3600. Since the formation of other elements are mentioned above, and thus a description thereof is omitted.

Figure 49:
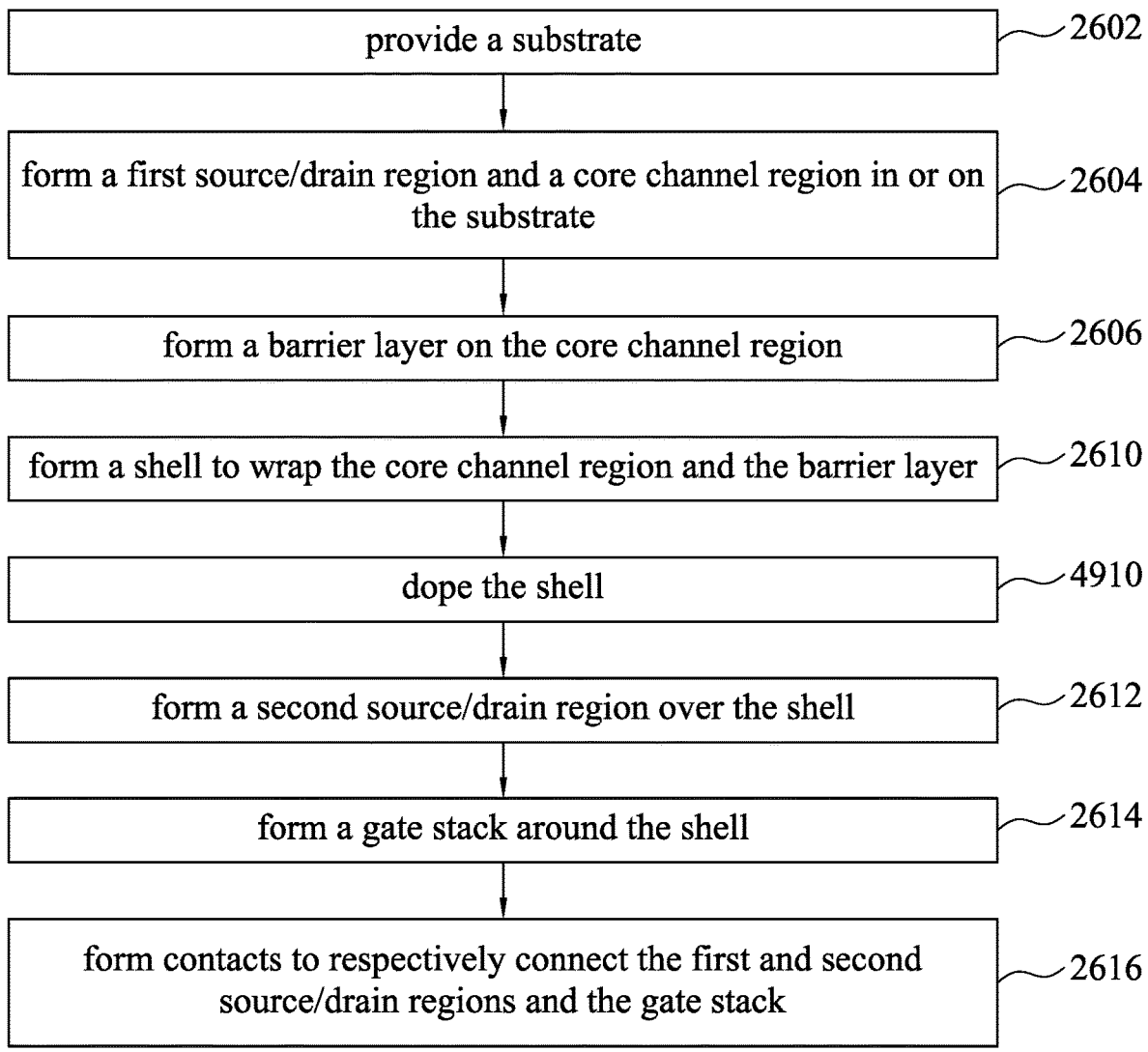
FIG. 49 is a flow chart of a method of manufacturing a semiconductor device in accordance with some embodiments of the present disclosure.
Figure 50:
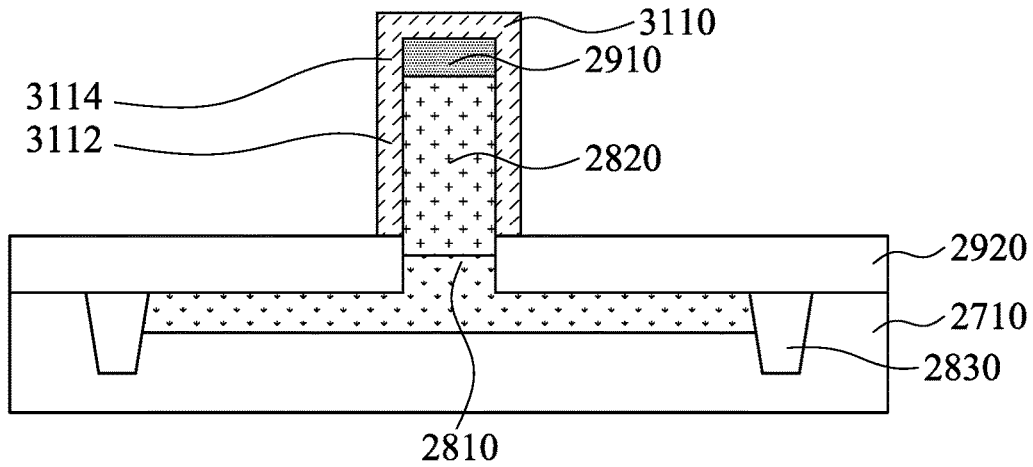
FIGS. 50-51 illustrate a semiconductor device at various stages according to aspects of the method of FIG. 49.
Figure 51:
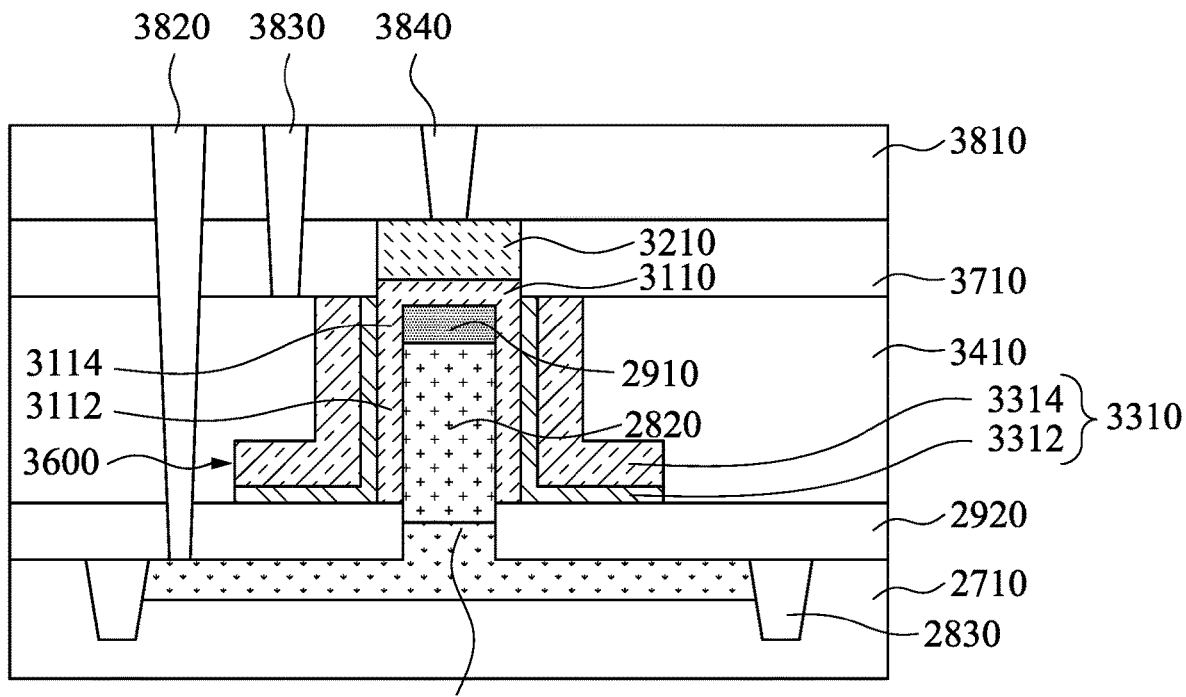

FIG. 49 is a flow chart of a method of manufacturing a semiconductor device in accordance with some embodiments of the present disclosure. FIGS. 50-51 illustrate a semiconductor device at various stages according to aspects of the method of FIG. 49. As shown in FIG. 49, the method 2600 omits the operation 2608 (see FIG. 26) and further includes an operation 4910. In some embodiments, the operation 4910 may be performed between the operations 2610 and 2612.

In some embodiments, the manufacturing processes of operations 2602 to 2606 and 2610 are performed in advance. Since the relevant manufacturing details are similar to FIGS. 27-29 and 31, and, therefore, a description in this regard will not be repeated hereinafter. The method 2600 proceeds to block 4910 where the shell is doped. Referring to the example of FIG. 50, in some embodiments of block 4910, the shell 3110 is doped.

In some embodiments, the channel portion 3112 and/or the barrier portion 3114 may be doped to modulate the band level thereof, and the present disclosure is not limited in this respect. For example, the channel portion 3112 can be doped with N-type dopants if the semiconductor device is an N-type device, and the channel portion 3112 can be doped with P-type dopants if the semiconductor device is a P-type device. The doping concentration of the channel portion 3112 can be from intrinsic to about $5 \times 10^{20}/cm^3$. The barrier portion 3114 can be doped with same or different doping concentration and conductivity types than the channel portion 3112. For instance a lower doping concentration of same conductivity type or even a doping concentration of opposite conductivity types of the barrier portion 3114 to that of channel portion 3112 can be used to reduce the band misalignment ΔE between the channel portion 3112 and the barrier portion 3114. The doping concentration of the barrier portion 3114 can be from about intrinsic to about $5 \times 10^{20}/cm^3$.

The method 2600 proceeds to blocks 2612, 2614, and 2616 and FIG. 51. Specifically, in the operation 2614, the gate stack 3600 includes the first gate 3310 and without the second gate 3610 (see FIG. 38). As such, the doped channel portion 3112 and the doped barrier portion 3114 provide electrostatic modulation at the barrier portion 3114 to align the energy bands of the channel portion 3112 and the barrier portion 3114. Moreover, since the formation of the second source/drain region 3210, the first gate 3310, and the contacts 3820-3840 are similar to that of the second source/drain region 3210, the first gate 3310, and the contacts 3820-3840 mentioned above, and thus a description thereof is omitted.

In some embodiments, the barrier layer 2910 in FIG. 51 is doped, and the doped barrier layer is similar to the barrier layer 2910' of FIG. 38. In some embodiments, the gate stack 3600 in FIG. 51 includes the first gate 3310 and the second gate 3610, and the gate stack 3600 is similar to the gate stack 3600 of FIG. 38.

Figure 52:
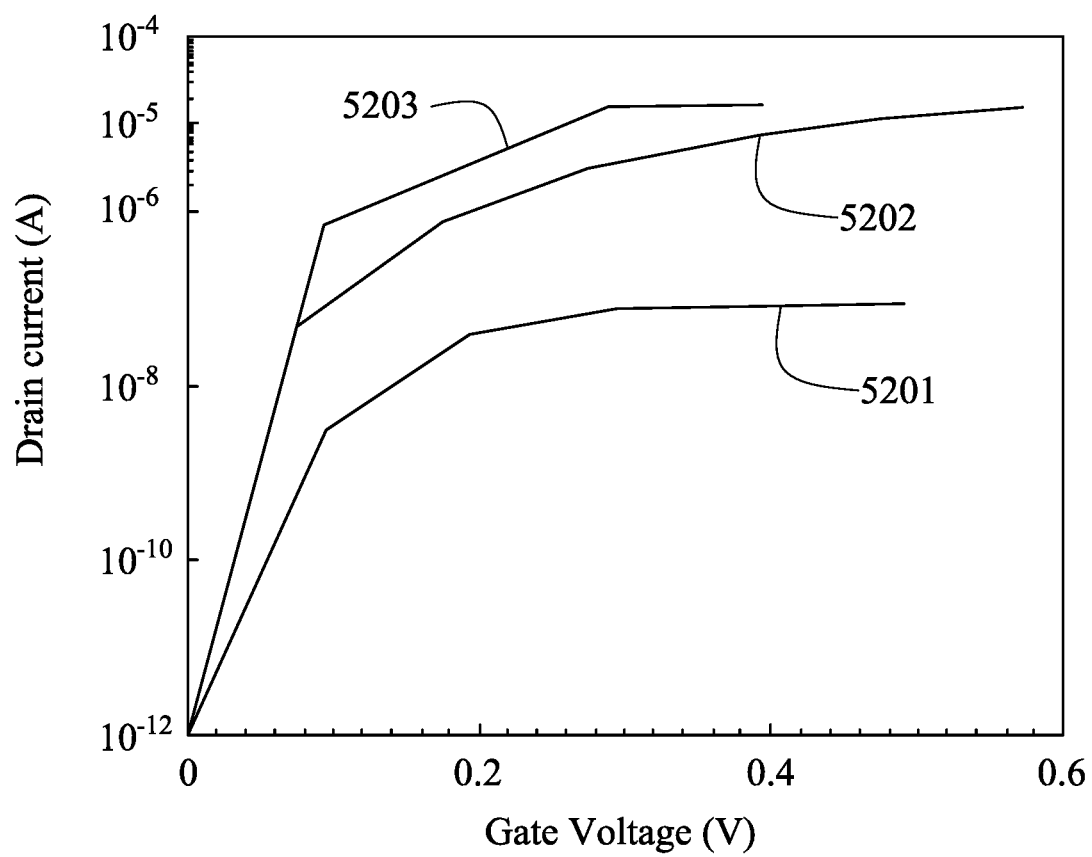
FIG. 52 illustrates I-V curves of semiconductor devices in accordance with some embodiments.

FIG. 52 illustrates I-V curves of semiconductor devices in accordance with some embodiments. In FIG. 52, the current flowing between the first and second source/drain regions of the semiconductor devices is illustrated as a function of the gate voltage (Vg) applied on the gate stack. Line 5201 is an I-V curve of the semiconductor device having a core channel region with low doping concentration (typically ≤~$5 \times 10^{18}/cm^3$). In such a case, the core-channel is depleted by the gate electric field in the on-state and the on-current remains very low (and too low for practical CMOS applications). More specifically the long tunneling distance created by the core channel depletion strongly suppresses the BTBT current in the on-state. Core channel depletion are mitigated by high core channel doping $N_{CC}$. Lines 5202 and 5203 are I-V curves of the semiconductor device having a core channel region with doping concentration of about $1 \times 10^{20}/cm^3$, i.e., sufficiently large so that core channel depletion is not observed in the on-state (It is noted that the doping is dimension dependent, i.e., depend of the diameter/thickness of the core channel layer, the smaller this diameter the higher the doping is but is at least ≥$5 \times 10^{18}/cm^3$). The on-state current is substantially increased (≥50 times). There are various ways to align the shell bands as disclosed in the present disclosure. One is to dope the barrier layer. Another possibility is to use a dual work-function gate, a third possibility is to use doping in the shell, or combinations of these methods.

According to some embodiments, it can be seen that the present disclosure offers advantages over TFET devices. It is understood, however, that other embodiments may offer additional advantages, and not all advantages are necessarily disclosed herein, and that no particular advantage is required for all embodiments. One advantage is that a device including dual gate stacks, doped barrier layer, and/or doped shell provides electrostatic modulation at a barrier portion of a shell. The band of the barrier portion can be substantially aligned with that of a channel portion of the shell. With such configuration, the on-state current of the device can be increased with low power consumption.

According to some embodiments, a semiconductor device includes first and second source/drain regions, a core channel region, a barrier layer, a shell, and a gate stack. The core channel region is between the first and second source/drain regions and is doped with first dopants. The barrier layer is between the core channel region and the second source/drain region and is doped with second dopants. The shell is over the core channel region and the barrier layer. The gate stack is over the shell.

In some embodiments, the core channel region has a doping concentration larger or equal to $5 \times 10^{18}/cm^3$.

In some embodiments, the second dopants of the barrier layer have a lower concentration than a concentration of the first dopants of the core channel region.

In some embodiments, the second dopants of the barrier layer have the same conductivity type as the first dopants of the core channel region.

In some embodiments, the second dopants of the barrier layer have different conductivity type from the first dopants of the core channel region.

In some embodiments, the first source/drain region is doped with third dopants, and the third dopants of the first source/drain region have the same conductivity type as the second dopants of the barrier layer.

In some embodiments, the second dopants of the barrier layer have a higher concentration than a concentration of the third dopants of first source/drain region.

In some embodiments, the shell includes a channel portion on the core channel region, the channel portion is doped with fourth dopants, and the fourth dopants of the shell have different conductivity type from the first dopants of the core channel region.

In some embodiments, the gate stack includes a first gate over the core channel region and a second gate over the barrier layer and having a different work function than the first gate.

In some embodiments, an equivalent oxide thickness of the second gate is lower than an equivalent oxide thickness of the first gate.

According to some embodiments, a semiconductor device includes first and second source/drain regions, a core channel region, a barrier layer, a shell, and a gate stack. The core channel region is between the first and second source/drain regions. The barrier layer is between the core channel region and the second source/drain region. The shell is over the core channel region and the barrier layer. The gate stack is over the shell. The gate stack includes a first gate over the core channel region and a second gate over the barrier layer and having a different work function than the first gate.

In some embodiments, the shell is intrinsic.

In some embodiments, the shell includes a channel portion on the core channel region and a barrier portion on the barrier layer. The channel portion is doped with a fourth dopants, and the barrier portion is doped with a fifth dopants. The fourth dopants of the channel portion of the shell have the same conductivity type as the fifth dopants of the barrier portion of the shell.

In some embodiments, the shell includes a channel portion on the core channel region and a barrier portion on the barrier layer. The channel portion is doped with a fourth dopants, and the barrier portion is doped with a fifth dopants. The fourth dopants of the channel portion of the shell have different conductivity type from the fifth dopants of the barrier portion of the shell.

According to some embodiments, a method for manufacturing a semiconductor device includes forming a first source/drain region and a core channel region on a substrate. A barrier layer is formed adjacent the core channel region. A shell that includes a channel portion over the core channel region and a barrier portion on the barrier layer is formed. A second source/drain region is formed adjacent the barrier layer. A conduction energy band of the channel portion of the shell is aligned with a conduction energy band of the barrier portion of the shell.

In some embodiments, aligning the conduction energy bands includes doping the barrier layer with second dopants that have the same conductivity type as first dopants of the core channel region.

In some embodiments, aligning the conduction bands includes forming a gate stack such that a first gate of the gate stack is over the core channel region and a second gate of the gate stack is over the barrier region and has a different work function than the first gate.

In some embodiments, aligning the conduction bands includes doping the channel portion of the shell with fourth dopants.

In some embodiments, forming the second source/drain region is performed after forming the shell.

In some embodiments, forming the second source/drain region is performed before forming the shell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first source/drain region in a substrate;
forming a core channel region on the first source/drain region;
forming a barrier layer on the core channel region;
forming a shell lining sidewalls of the core channel region and sidewalls and top surface of the barrier layer, wherein the shell comprises a channel portion in contact with the core channel region and a barrier portion in contact with the barrier layer;
forming a second source/drain region above the shell;
forming a first gate electrode to surround the channel portion of the shell; and
aligning a conduction energy band of the channel portion of the shell with a conduction energy band of the barrier portion of the shell.

2. The method of claim 1, wherein aligning the conduction energy bands comprises forming a second gate electrode to surround the barrier portion of the shell, wherein a work function of the first gate electrode is smaller than a work function of the second gate electrode.

3. The method of claim 1, wherein aligning the conduction energy bands is such that a difference between the conduction energy bands of the channel portion and the barrier portion of the shell is less than about 0.2 eV.

4. The method of claim 1, wherein aligning the conduction energy bands comprises doping the channel portion of the shell with first dopants and doping the barrier portion of the shell with second dopants.

5. The method of claim 4, wherein the second dopants of the barrier portion have a conductivity type the same as the first dopants of the channel portion, and a doping concentration of the second dopants of the barrier portion is less than a doping concentration of the first dopants of the channel portion.

6. The method of claim 4, wherein the second dopants of the barrier portion have a conductivity type different from the first dopants of the channel portion.

7. A method, comprising:
forming a first source/drain region in a substrate;
forming a core channel region, a barrier layer, and a second source/drain region over the first source/drain region;
forming a shell on sidewalls of the core channel region and the barrier layer, wherein the shell comprises a channel portion in contact with the core channel region and a barrier portion in contact with the barrier layer;
forming a first gate electrode to surround the core channel region of the shell; and
aligning a conduction energy band of the channel portion of the shell with a conduction energy band of the barrier portion of the shell.

8. The method of claim 7, wherein forming the shell comprises:
forming a semiconductor material on the sidewalls of the core channel region and the barrier layer and a sidewall of the second source/drain region; and
doping a portion of the semiconductor material in contact with the second source/drain region such that another portion of the semiconductor material on the sidewalls of the core channel region and the barrier layer forms the shell.

9. The method of claim 7, wherein aligning the conduction energy band of the channel portion of the shell with the conduction energy band of the barrier portion of the shell comprises forming a second gate electrode to surround the barrier layer.

10. The method of claim 9, wherein the core channel region is p-type, and a work function of the first gate electrode is smaller than a work function of the second gate electrode.

11. The method of claim 9, wherein the core channel region is n-type, and a work function of the first gate electrode is greater than a work function of the second gate electrode.

12. The method of claim 9, wherein an equivalent oxide thickness (EOT) of the second gate electrode is smaller than that of the first gate electrode.

13. The method of claim 7, further comprising forming a doped layer over the barrier layer, and the second source/drain region is formed over the doped layer, wherein a dopant concentration of the doped layer increases in a direction from the barrier layer towards the second source/drain region.

14. A method, comprising:
forming a first source/drain region in a substrate;

sequentially forming a barrier layer, a core channel region, and a second source/drain region over the first source/drain region;

forming a shell lining sidewalls of the core channel region and the barrier layer, wherein the shell comprises a channel portion in contact with the core channel region and a barrier portion in contact with the barrier layer;

forming a first gate electrode to surround the core channel region of the shell; and aligning a conduction energy band of the channel portion of the shell with a conduction energy band of the barrier portion of the shell.

15. The method of claim 14, wherein aligning the conduction energy bands is such that a difference between the conduction energy bands of the channel portion and the barrier portion of the shell is less than about 0.2 eV.

16. The method of claim 14, wherein the barrier layer has dopants with a conductivity type the same as dopants of the core channel region.

17. The method of claim 14, wherein the barrier layer has dopants with a conductivity type different from dopants of the core channel region.

18. The method of claim 14, wherein aligning the conduction energy bands comprises doping the channel portion of the shell with first dopants.

19. The method of claim 18, wherein aligning the conduction energy bands further comprises doping the barrier portion of the shell with second dopants, and the barrier portion of the shell has a lower doping concentration of same conductivity type as that of the channel portion of the shell.

20. The method of claim 18, wherein aligning the conduction energy bands further comprises doping the barrier portion of the shell with second dopants, and the second dopants have opposite conductivity types to that of the first dopants.

* * * * *